United States Patent
Tanaka

(10) Patent No.: US 11,561,248 B2
(45) Date of Patent: Jan. 24, 2023

(54) RESISTANCE MAPPING DEVICE, RESISTANCE MEASUREMENT METHOD, AND RECORDING MEDIUM

(71) Applicant: KABUSHIKI KAISHA TOSHIBA, Tokyo (JP)

(72) Inventor: Akira Tanaka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 116 days.

(21) Appl. No.: 17/217,114

(22) Filed: Mar. 30, 2021

(65) Prior Publication Data

US 2021/0311099 A1 Oct. 7, 2021

(30) Foreign Application Priority Data

Apr. 1, 2020 (JP) .............................. JP2020-065528
Mar. 11, 2021 (JP) .............................. JP2021-039088

(51) Int. Cl.
| | |
|---|---|
| *G01R 27/08* | (2006.01) |
| *G01N 27/04* | (2006.01) |
| *H01L 21/66* | (2006.01) |

(52) U.S. Cl.
CPC ............ *G01R 27/08* (2013.01); *G01N 27/041* (2013.01); *H01L 22/14* (2013.01)

(58) Field of Classification Search
CPC ........ G01R 27/00; G01R 27/02; G01R 27/08; G01N 27/00; G01N 27/02; G01N 27/04; G01N 27/041; H01L 22/00; H01L 22/10; H01L 22/14

USPC ............. 324/600, 649, 691, 693; 702/47, 53
See application file for complete search history.

(56) References Cited

U.S. PATENT DOCUMENTS

| | | | |
|---|---|---|---|
| 4,703,252 A | 10/1987 | Perloff et al. | |
| 5,491,427 A | 2/1996 | Ueno et al. | |
| 7,737,712 B2 * | 6/2010 | Kim .................... | G01R 31/3191 324/601 |
| 7,843,198 B2 * | 11/2010 | Sato .................... | G01R 31/2889 324/538 |

(Continued)

FOREIGN PATENT DOCUMENTS

| | | | |
|---|---|---|---|
| EP | 0382868 A1 * | 8/1990 | ............. G01R 27/08 |
| JP | 07-063788 A | 3/1995 | |

(Continued)

*Primary Examiner* — Hoai-An D. Nguyen
(74) *Attorney, Agent, or Firm* — Oblon, McClelland, Maier & Neustadt, L.L.P.

(57) ABSTRACT

A resistance mapping device includes: a first chip including a first surface, a second surface positioned at a side opposite to the first surface, and a plurality of first electrodes provided at the first surface; a second chip including a third surface facing the first surface, a fourth surface positioned at a side opposite to the third surface, and a plurality of second electrodes provided at the third surface; and a measurement part, the measurement part being configured to measure a resistance of a portion of a measurement object, the portion of the measurement object being between the first electrode and the second electrode that correspond to each other among the plurality of first electrodes and the plurality of second electrodes, and acquire mapping data in which measured values of the resistances are associated with positions of the measurement object corresponding to the plurality of first electrodes.

15 Claims, 14 Drawing Sheets

(56) References Cited

U.S. PATENT DOCUMENTS

| | | | |
|---|---|---|---|
| 10,295,566 B2* | 5/2019 | Cadena | G01R 1/0735 |
| 10,845,387 B2* | 11/2020 | Lee | G01R 1/06772 |
| 2009/0117673 A1 | 5/2009 | Matsushita et al. | |
| 2009/0121730 A1 | 5/2009 | Kimura et al. | |
| 2011/0043239 A1 | 2/2011 | Tomita et al. | |
| 2015/0123693 A1 | 5/2015 | Ota et al. | |

FOREIGN PATENT DOCUMENTS

| | | | | |
|---|---|---|---|---|
| JP | 2005221450 A | * | 8/2005 | G01P 15/0802 |
| JP | 2006-105801 A | | 4/2006 | |
| JP | 2007163463 A | * | 6/2007 | G01R 1/0483 |
| JP | 2007-309797 A | | 11/2007 | |
| JP | 2009-111135 A | | 5/2009 | |
| WO | WO 2007/121752 A1 | | 11/2007 | |

\* cited by examiner

RESISTANCE MAPPING DEVICE, RESISTANCE MEASUREMENT METHOD, AND RECORDING MEDIUM

CROSS-REFERENCE TO RELATED APPLICATIONS

This application is based upon and claims the benefit of priority from the prior Japanese Patent Application No. 2020-065528, filed on Apr. 1, 2020; and Japanese Patent Application No. 2021-039088, filed on Mar. 11, 2021; the entire contents of which are incorporated herein by reference.

FIELD

Embodiments relate to a resistance mapping device, a resistance measurement method, and a recording medium.

BACKGROUND

A conventional resistance measuring device such as a multimeter or the like measures the resistance of a measurement object disposed between a pair of electrodes by applying a voltage between the pair of electrodes. However, such a resistance measuring device can measure only the resistance of the portion of the measurement object between the pair of electrodes.

DETAILED DESCRIPTION

Figure 1:
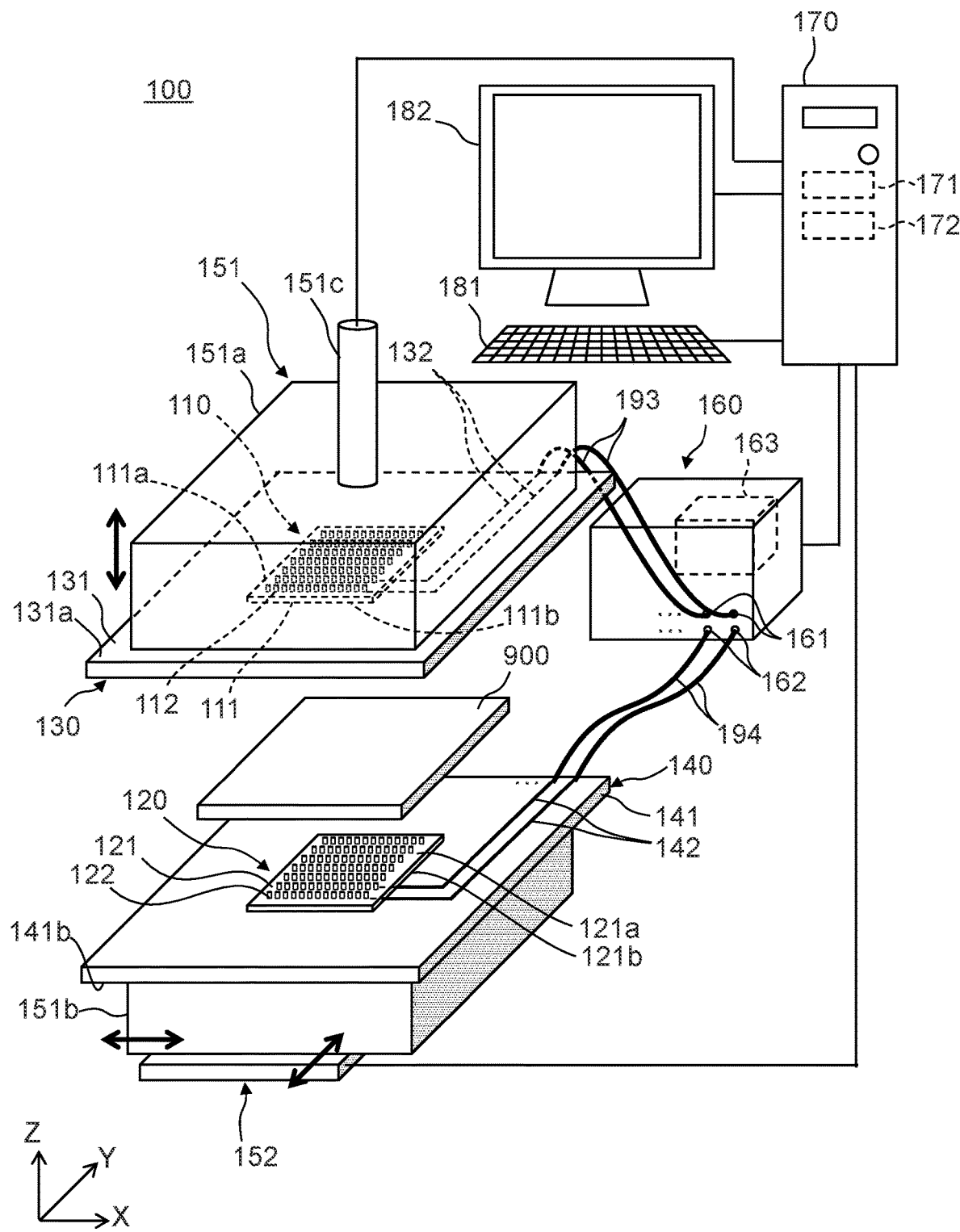
FIG. 1 is a perspective view showing a resistance mapping device according to a first embodiment.

In general, according to one embodiment, a resistance mapping device includes: a first chip including a first surface, a second surface positioned at a side opposite to the first surface, and a plurality of first electrodes provided at the first surface; a second chip including a third surface facing the first surface, a fourth surface positioned at a side opposite to the third surface, and a plurality of second electrodes provided at the third surface, the plurality of second electrodes corresponding to the plurality of first electrodes; and a measurement part electrically connected to the plurality of first electrodes and the plurality of second electrodes, the measurement part being configured to measure a resistance of a portion of a measurement object in a state in which the measurement object is disposed between the first chip and the second chip, the portion of the measurement object being between the first electrode and the second electrode that correspond to each other among the plurality of first electrodes and the plurality of second electrodes, and acquire mapping data in which measured values of the resistances are associated with positions of the measurement object corresponding to the plurality of first electrodes.

In general, according to one embodiment, a resistance measurement method includes: disposing a measurement object between a first chip and a second chip, the first chip including a first surface, a second surface positioned at a side opposite to the first surface, and a plurality of first electrodes provided at the first surface, the second chip including a third surface facing the first surface, a fourth surface positioned at a side opposite to the third surface, and a plurality of second electrodes provided at the third surface, the plurality of second electrodes corresponding to the plurality of first electrodes; and measuring a resistance of a portion of the measurement object between one of the plurality of first electrodes and one of the plurality of second electrodes, and a resistance of a portion of the measurement object between an other one of the plurality of first electrodes and an other one of the plurality of second electrodes.

In general, according to one embodiment, a recording medium storing a program. The program configured to cause a processor to perform at least: measuring a resistance of a portion of a measurement object between one of a plurality of first electrodes and one of a plurality of second electrodes in a state in which the measurement object is disposed between a first chip and a second chip, and a resistance of a portion of the measurement object between an other one of the plurality of first electrodes and an other one of the plurality of second electrodes in the state in which the measurement object is disposed between the first chip and the second chip, the first chip including a first surface, a second surface positioned at a side opposite to the first surface, and the plurality of first electrodes provided at the first surface, the second chip including a third surface facing the first surface, a fourth surface positioned at a side opposite to the third surface, and the plurality of second electrodes provided at the third surface, the plurality of second electrodes corresponding to the plurality of first electrodes.

First Embodiment

First, a first embodiment will be described.

FIG. 1 is a perspective view showing a resistance mapping device according to the embodiment.

Figure 2:
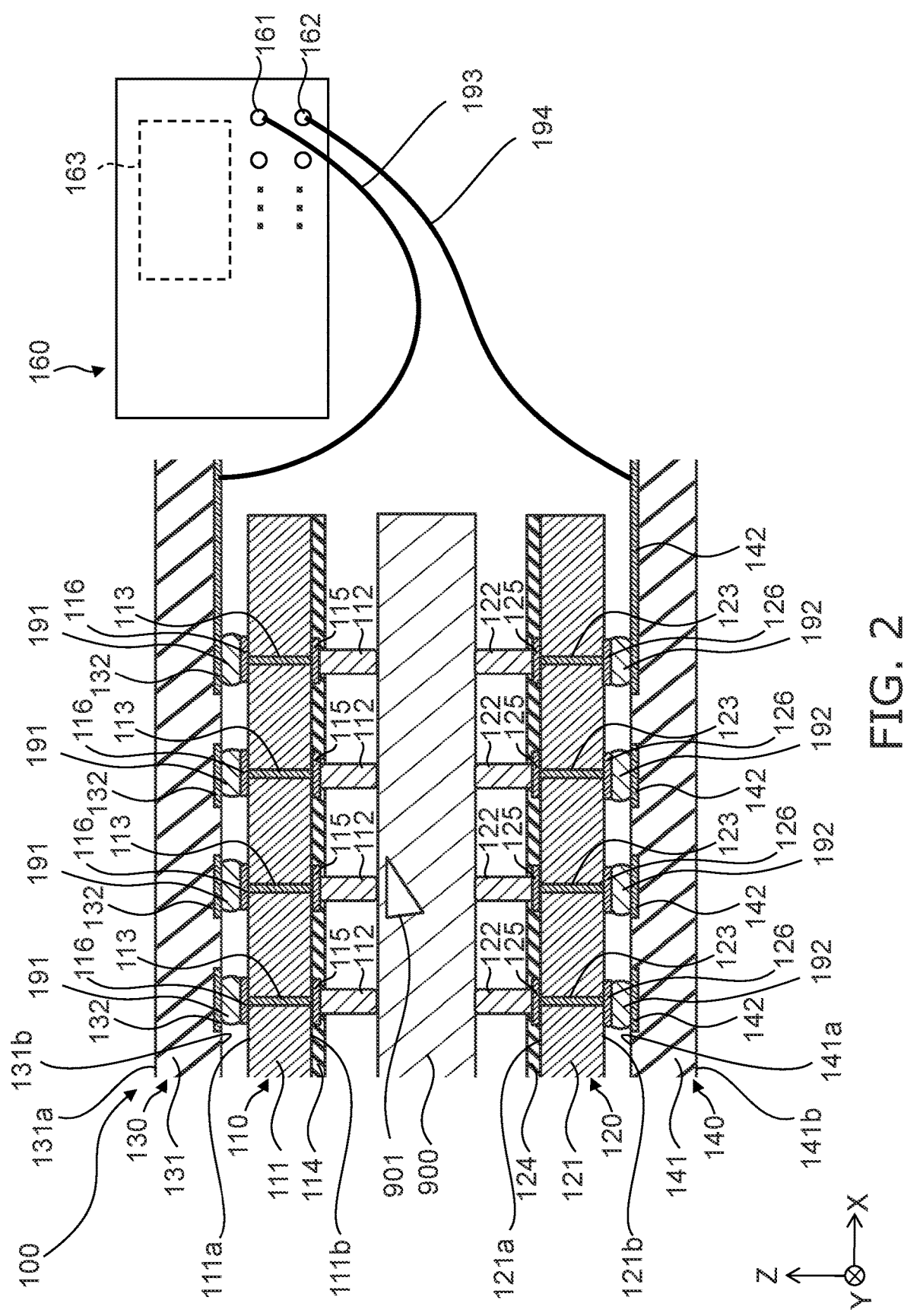
FIG. 2 is a partial end view showing the resistance mapping device according to the first embodiment.

FIG. 2 is a partial end view showing the resistance mapping device according to the embodiment.

Generally speaking, as shown in FIG. 1, the resistance mapping device 100 (the resistance measuring device 100) according to the embodiment includes a first chip 110, a second chip 120, a first wiring substrate 130, a second wiring substrate 140, a pressing mechanism 151, a position adjustment mechanism 152, a measurement part 160, a controller 170, an operation part 181, and a displayer 182.

According to the embodiment, the resistance mapping device 100 is used to measure the surface distribution of the resistance of a measurement object 900. For example, a film, a sheet, a plate, and the like that include conductive evaluation object portions are examples of the measurement object 900. By measuring the surface distribution of the resistance of the measurement object 900, it can be estimated whether or not a defect such as a void 901, a resistance value change, or the like exists inside the measurement object 900 without damaging the measurement object 900 as shown in FIG. 2.

Components of the resistance mapping device 100 will now be elaborated. An XYZ orthogonal coordinate system is used hereinbelow. The direction from the second chip 120 toward the first chip 110 is called a "Z-direction" or the "upward direction". The opposite direction of the upward direction is called the "downward direction". One direction orthogonal to the Z-direction is called an "X-direction". One direction orthogonal to the Z-direction and the X-direction is called a "Y-direction".

The first chip 110 is a semiconductor element. As shown in FIG. 2, the first chip 110 includes a substrate 111, multiple first electrodes 112, multiple first through-electrodes 113, and a cover layer 114.

For example, the substrate 111 is made of a semiconductor material such as silicon, etc. According to the embodiment as shown in FIG. 1, the substrate 111 is rectangular when viewed in plan. However, the shape of the substrate 111 when viewed in plan is not limited to that described above.

As shown in FIG. 2, the surfaces of the substrate 111 include an upper surface 111a and a lower surface 111b. The upper surface 111a is parallel to the X-direction and the Y-direction. The lower surface 111b is positioned at the side opposite to the upper surface 111a. The lower surface 111b is parallel to the X-direction and the Y-direction. The multiple first electrodes 112 are disposed at the lower surface 111b of the substrate 111. Also, the multiple first through-electrodes 113 that extend through the substrate 111 in the thickness direction are provided in the substrate 111 to correspond to the multiple first electrodes 112. The number of the first through-electrodes 113 is equal to the number of the first electrodes 112.

Each first electrode 112 is a bump and is made of a conductive material such as copper, solder, etc. Each first electrode 112 is, for example, substantially circular columnar. Each first electrode 112 protrudes in the downward direction from the lower surface 111b.

Figure 3:
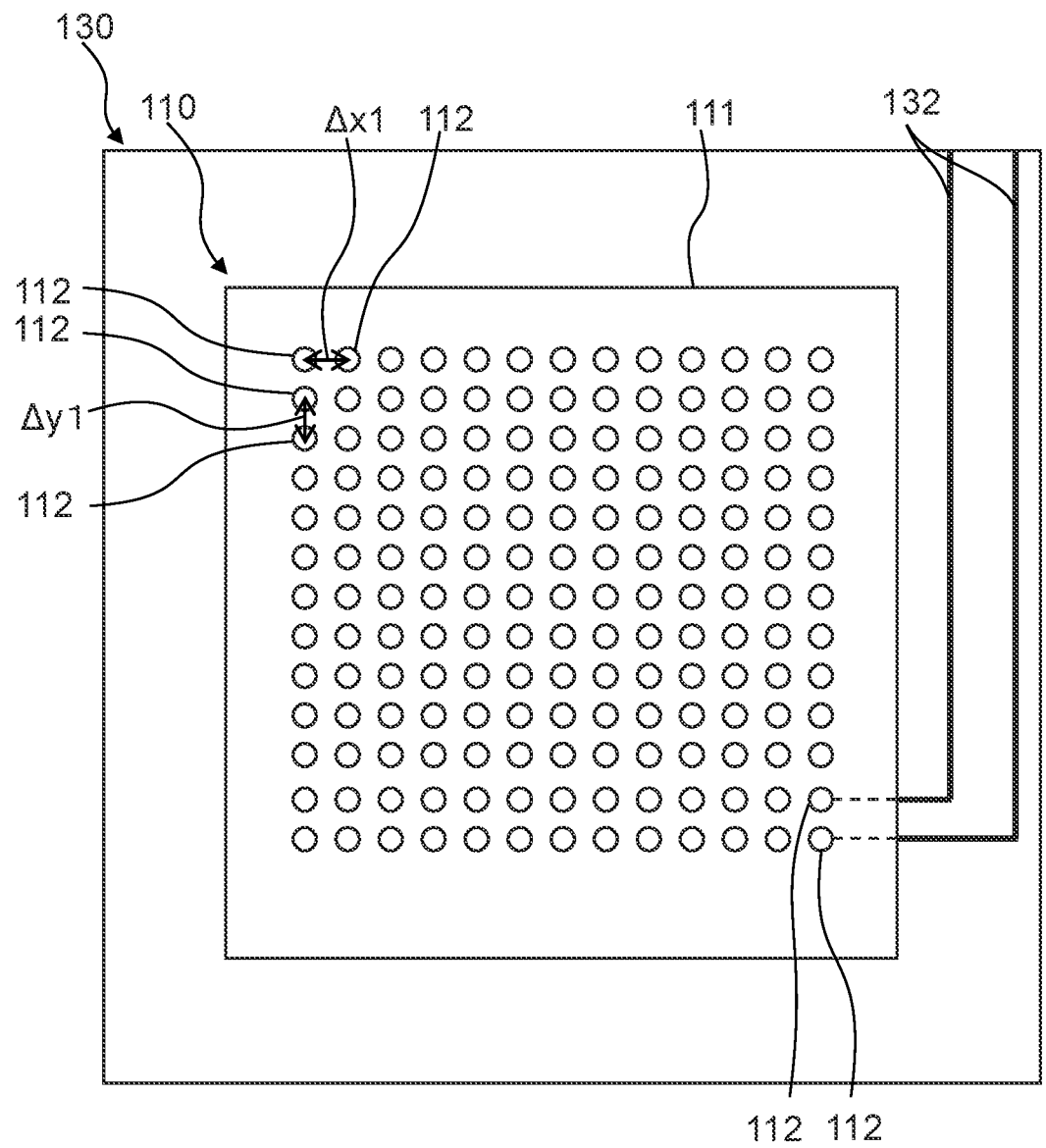
FIG. 3 is a plan view showing a first chip and a first wiring substrate of the resistance mapping device according to the first embodiment.

FIG. 3 is a plan view showing the first chip and the first wiring substrate of the resistance mapping device according to the embodiment.

According to the embodiment, the multiple first electrodes 112 are arranged at substantially uniform spacing in the X-direction and the Y-direction. In other words, the multiple first electrodes 112 are arranged in a lattice configuration in the X-direction and the Y-direction. In FIG. 3, a total of 169 first electrodes 112 are arranged in thirteen rows in the Y-direction and thirteen columns in the X-direction. However, the number of the first electrodes 112 is not limited to that described above. The multiple first electrodes 112 are separated from each other. According to the embodiment, a distance $\Delta x1$ between the centers of the first electrodes 112 next to each other in the X-direction is substantially equal to a distance $\Delta y1$ between the centers of the first electrodes 112 next to each other in the Y-direction. It is favorable for the distance $\Delta x1$ and the distance $\Delta y1$ to be not less than 40 µm and not more than 2000 µm. However, it is sufficient for the multiple first electrodes 112 to be dispersed on the lower surface 111b; the arrangement pattern of the multiple first electrodes 112 is not limited to that described above. For example, the distance $\Delta x1$ and the distance $\Delta y1$ may be different from each other.

As shown in FIG. 2, each first through-electrode 113 is made of a conductive material such as copper, etc. The multiple first through-electrodes 113 are electrically connected respectively to the multiple first electrodes 112. Each first through-electrode 113 extends from the lower surface 111b toward the upper surface 111a of the substrate 111. The lower end of each first through-electrode 113 contacts a conductive member 115. Each first through-electrode 113 is electrically connected to the corresponding first electrode 112 via the conductive member 115. The upper end of each first through-electrode 113 contacts a conductive member 116. The multiple first through-electrodes 113 are separated from each other.

The cover layer 114 covers the lower surface 111b of the substrate 111. For example, the cover layer 114 is made of a resin material.

The second chip 120 is a semiconductor element. The second chip 120 is disposed below the first chip 110. The measurement object 900 is disposed between the first chip 110 and the second chip 120. The second chip 120 includes a substrate 121, multiple second electrodes 122, multiple second through-electrodes 123, and a cover layer 124.

For example, the substrate 121 is made of a semiconductor material such as silicon, etc. According to the embodiment as shown in FIG. 1, the substrate 121 is rectangular when viewed in plan. However, the shape of the substrate 121 when viewed in plan is not limited to that described above.

As shown in FIG. 2, the surfaces of the substrate 121 include an upper surface 121a and a lower surface 121b. The upper surface 121a is parallel to the X-direction and the Y-direction. The upper surface 121a faces the lower surface 111b of the first chip 110. The multiple second electrodes 122 that correspond to the multiple first electrodes 112 are located at the upper surface 121a. The number of the second electrodes 122 is equal to the number of the first electrodes 112. The lower surface 121b is positioned at the side opposite to the upper surface 121a. The lower surface 121b is parallel to the X-direction and the Y-direction. The multiple second through-electrodes 123 that extend through the substrate 121 in the thickness direction are provided in the substrate 121 to correspond to the multiple second electrodes 122. The number of the second through-electrodes 123 is equal to the number of the second electrodes 122.

Each second electrode 122 is a bump and is made of a conductive material such as copper, solder, etc. Each second electrode 122 is, for example, substantially circular columnar. Each second electrode 122 protrudes in the upward direction from the upper surface 121a.

Figure 4:
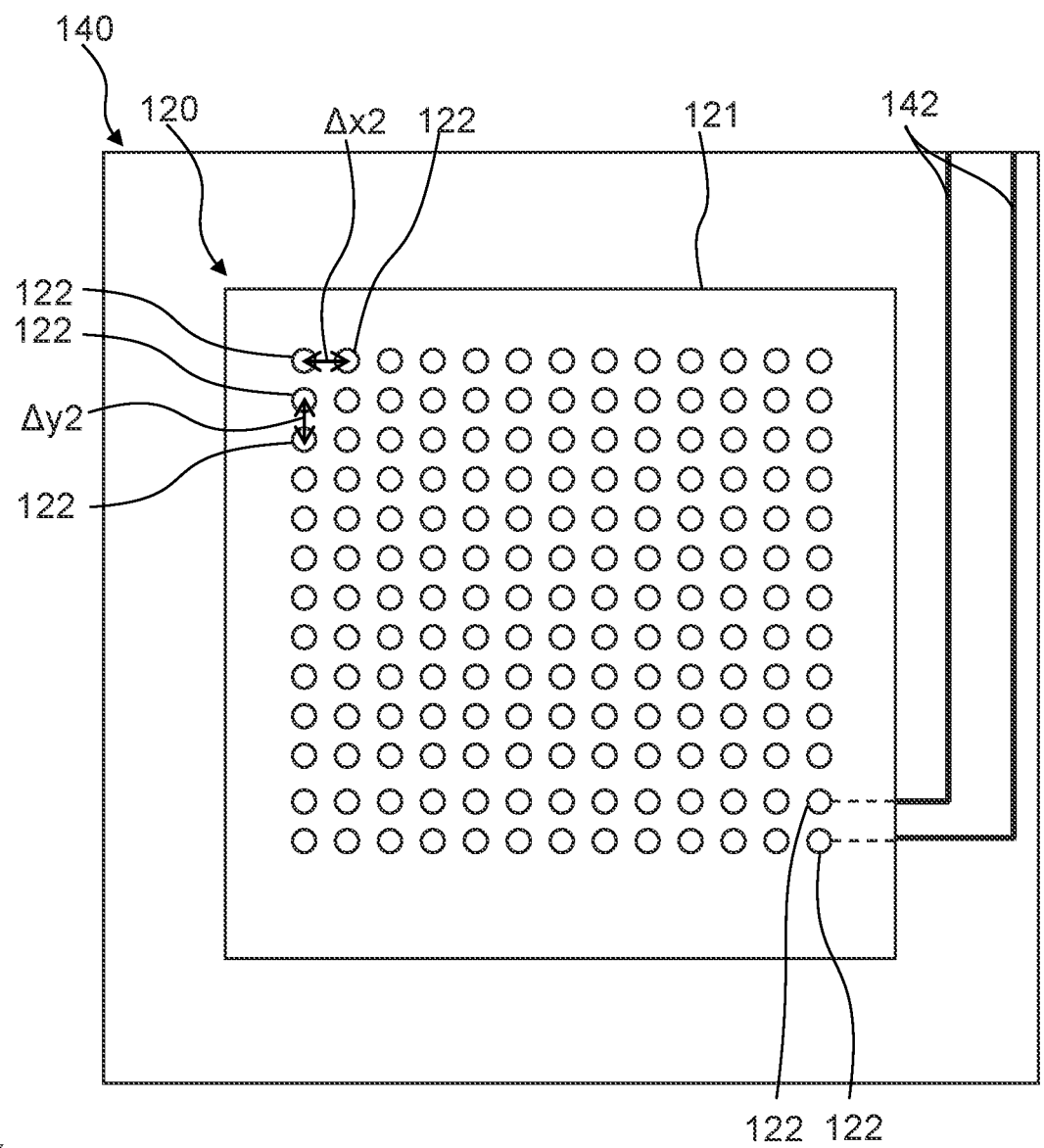
FIG. 4 is a plan view showing a second chip and a second wiring substrate of the resistance mapping device according to the first embodiment.
Figure 4:
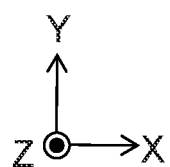

FIG. 4 is a plan view showing the second chip and the second wiring substrate of the resistance mapping device according to the embodiment.

Similarly to the multiple first electrodes 112, the multiple second electrodes 122 are arranged at substantially uniform spacing in the X-direction and the Y-direction. In other words, the multiple second electrodes 122 are arranged in a lattice configuration in the X-direction and the Y-direction. In FIG. 4, a total of 169 second electrodes 122 are provided in thirteen rows in the Y-direction and thirteen columns in the X-direction. However, the number of the second electrodes 122 is not limited to that described above as long as the number of the second electrodes 122 is equal to the number of the first electrodes 112. The multiple second electrodes 122 are separated from each other. A distance Δx2 between the centers of the second electrodes 122 next to each other in the X-direction is substantially equal to the distance Δx1 between the centers of the first electrodes 112 next to each other in the X-direction (referring to FIG. 3). Similarly, a distance Δy2 between the centers of the second electrodes 122 next to each other in the Y-direction is substantially equal to the distance Δy1 between the centers of the first electrodes 112 next to each other in the Y-direction (referring to FIG. 3).

Hereinbelow, when each first electrode of the multiple first electrodes respectively faces some second electrode 122 of the multiple second electrodes 122 as shown in FIG. 2, the first electrode 112 and the second electrode 122 that have the shortest distance therebetween among the multiple first electrodes 112 and the multiple second electrodes 122 are called "the first and second electrodes 112 and 122 that correspond to each other".

As shown in FIG. 2, each second through-electrode 123 is made of a conductive material such as copper, etc. The multiple second through-electrodes 123 are connected respectively with the multiple second electrodes 122. Each second through-electrode 123 extends from the upper surface 121a toward the lower surface 121b of the substrate 121. The upper end of each second through-electrode 123 contacts a conductive member 125. Each second through-electrode 123 is electrically connected to the corresponding second electrode 122 via the conductive member 125. The lower end of each second through-electrode 123 contacts a conductive member 126. The multiple second through-electrodes 123 are separated from each other.

The cover layer 124 covers the upper surface 121a of the substrate 121. For example, the cover layer 124 is made of a resin material.

As shown in FIG. 1, the first wiring substrate 130 is mounted to the upper surface 111a of the substrate 111 of the first chip 110. The first wiring substrate 130 functions as an interposer that provides routing of the electrical connection between the first chip 110 and the measurement part 160.

The first wiring substrate 130 includes a substrate 131, and multiple first interconnects 132 that correspond to the multiple first through-electrodes 113. Accordingly, the number of the first interconnects 132 is equal to the number of the first through-electrodes 113, i.e., the number of the first electrodes 112. In FIGS. 1 and 3, two first interconnects 132 of the multiple first interconnects 132 are shown, and the remaining first interconnects 132 are not illustrated.

The substrate 131 is rectangular when viewed in plan. However, the shape of the substrate 131 when viewed in plan is not limited to that described above. As shown in FIG. 2, the surfaces of the substrate 131 include an upper surface 131a and a lower surface 131b. The upper surface 131a is parallel to the X-direction and the Y-direction. The lower surface 131b is positioned at the side opposite to the upper surface 131a. The multiple first interconnects 132 are formed at the lower surface 131b. The multiple first interconnects 132 are separated from each other.

Each first interconnect 132 is made of a conductive material such as copper, etc. A portion of each first interconnect 132 is disposed directly above the corresponding first through-electrode 113. The conductive member 116 and a bonding member 191 that is made of a conductive material such as solder, etc., are disposed between a portion of each first interconnect 132 and the corresponding first through-electrode 113. Each first interconnect 132 is electrically connected to the corresponding first through-electrode 113 via the bonding member 191 and the conductive member 116.

As shown in FIG. 3, the surface area of the first wiring substrate 130 is greater than the surface area of the first chip 110 when viewed in plan. Therefore, the spacing between the portions of the first interconnects 132 that are next to each other and are connected to the measurement part 160 can be widened. As a result, the measurement part 160 can be easily connected to each first interconnect 132.

As shown in FIG. 1, the second wiring substrate 140 is mounted to the lower surface 121b of the substrate 121 of the second chip 120. The second wiring substrate 140 functions as an interposer that provides routing of the electrical connection between the second chip 120 and the measurement part 160.

The second wiring substrate 140 includes a substrate 141, and multiple second interconnects 142 that correspond to the multiple second through-electrodes 123. Accordingly, the number of the second interconnects 142 is equal to the number of the second through-electrodes 123, i.e., the number of the second electrodes 122. In FIGS. 1 and 4, two second interconnects 142 of the multiple second interconnects 142 are shown; the remaining second interconnects 142 are not illustrated.

The substrate 141 is rectangular when viewed in plan. However, the shape of the substrate 141 when viewed in plan is not limited to that described above. As shown in FIG. 2, the surfaces of the substrate 141 include an upper surface 141a and a lower surface 141b. The multiple second interconnects 142 are formed at the upper surface 141a. The lower surface 141b is positioned at the side opposite to the upper surface 141a. The lower surface 141b is parallel to the X-direction and the Y-direction.

Each second interconnect 142 is made of a conductive material such as copper, etc. A portion of each second interconnect 142 is disposed directly under the corresponding second through-electrode 123. The conductive member 126 and a bonding member 192 that is made of a conductive material such as solder, etc., are disposed between a portion of each second interconnect 142 and the corresponding second through-electrode 123. Each second interconnect 142 is electrically connected to the corresponding second through-electrode 123 via the bonding member 192 and the conductive member 126.

As shown in FIG. 4, the surface area of the second wiring substrate 140 is greater than the surface area of the second chip 120 when viewed in plan. Therefore, the spacing between the portions of the second interconnect 142 that are next to each other and are connected to the measurement part 160 can be widened. As a result, the second interconnect 142 and the measurement part 160 can be easily connected.

As shown in FIG. 1, the pressing mechanism 151 presses the first electrodes 112 and the second electrodes 122 onto the measurement object 900. Thereby, the electrodes 112 and 122 press the measurement object 900.

According to the embodiment, the pressing mechanism 151 includes a pair of clamping members 151a and 151b that is configured to clamp the first wiring substrate 130 and the second wiring substrate 140 in the vertical direction, and a driver 151c that is configured to cause the pair of clamping members 151a and 151b to relatively approach and separate. The clamping member 151a is mounted to the upper surface 131a of the first wiring substrate 130. The clamping member 151b is mounted to the lower surface 141b of the second wiring substrate 140. The clamping member 151a presses a region of the first wiring substrate 130 that is wider than the region at which the first chip 110 is disposed. The clamping member 151b presses a region of the second wiring substrate 140 that is wider than the region at which the second chip 120 is disposed. The fluctuation of the spacing between the lower surface 111b of the first chip 110 and the upper surface 121a of the second chip 120 at each position in the X-direction and the Y-direction can be suppressed thereby. As a result, the fluctuation of the force (the pressure) of the electrodes 112 and 122 pressing the measurement object 900 can be suppressed.

However, the configuration of the pressing mechanism 151 is not limited to that described above. For example, the pressing mechanism 151 may press multiple positions of the first wiring substrate 130 and the second wiring substrate 140 when viewed in plan such as pressing the four corners of the first wiring substrate 130 and the second wiring substrate 140 when viewed in plan. In such a configuration as well, the fluctuation of the pressure of the electrodes 112 and 122 can be suppressed.

The position adjustment mechanism 152 adjusts the relative positions in the X-direction and the Y-direction of the multiple first electrodes 112 and the multiple second electrodes 122. Thereby, each first electrode 112 can be caused to face one second electrode 122 of the multiple second electrodes 122. According to the embodiment, the position adjustment mechanism 152 moves the multiple second electrodes 122 in the X-direction and the Y-direction by moving the clamping member 151b in the X-direction and the Y-direction.

However, the configuration of the position adjustment mechanism 152 is not limited to that described above. For example, the position adjustment mechanism 152 may move the clamping member 151a and the driver 151c of the pressing mechanism 151 in the X-direction and the Y-direction. Also, the position adjustment mechanism 152 may not be provided in the resistance mapping device 100. In other words, each first electrode 112 may not face one second electrode 122 of the multiple second electrodes 122 when measuring.

According to the embodiment, the measurement part 160 includes multiple first terminals 161 that correspond to the multiple first interconnects 132 of the first wiring substrate 130, and multiple second terminals 162 that correspond to the multiple second interconnects 142 of the second wiring substrate 140. In other words, the number of the first terminals 161 is equal to the number of the first interconnects 132, i.e., the number of the first electrodes 112. Also, the number of the second terminals 162 is equal to the number of the second interconnects 142, i.e., the number of the second electrodes 122.

Each first terminal 161 is connected to the corresponding first interconnect 132 of the first wiring substrate 130 via a first lead wire 193. Each second terminal 162 is connected to the corresponding second interconnect 142 of the second wiring substrate 140 via a second lead wire 194.

Hereinbelow, the first electrode 112 and the second electrode 122 that correspond to each other are called the "pair of electrodes 112 and 122"; the first terminal 161 and the second terminal 162 that are connected to the pair of electrodes 112 and 122 are called the "pair of terminals 161 and 162".

The measurement part 160 includes a data acquisition part 163 that measures the resistance between each pair of electrodes 112 and 122 via each pair of terminals 161 and 162 and acquires mapping data D in which the measured values of the resistances are associated with the positions that correspond to the multiple first electrodes 112. The data acquisition part 163 includes an analog circuit, a CPU (Central Processing Unit), memory, etc.

According to the embodiment, the data acquisition part 163 applies a prescribed voltage between each pair of electrodes 112 and 122 via each pair of terminals 161 and 162 and measures the current that flows between each pair of electrodes 112 and 122. Then, the data acquisition part 163 calculates the resistance between each pair of electrodes 112 and 122 from the prescribed voltage and the measured current for each pair of electrodes 112 and 122. However, the measurement method of the resistance is not limited to that described above. For example, the data acquisition part 163 may cause a prescribed current to flow between each pair of electrodes 112 and 122 via each pair of terminals 161 and 162, measure the voltage between each pair of electrodes 112 and 122, and calculate the resistance between each pair of electrodes 112 and 122 from the prescribed current and the measured voltage for each pair of electrodes 112 and 122. Also, the data acquisition part 163 may measure both the voltage and the current of each pair of terminals 161 and 162 and may estimate the resistance between each pair of electrodes 112 and 122 from the measured voltage and current for each pair of electrodes 112 and 122. Thus, according to the embodiment, the resistance mapping device 100 uses a two-terminal method to measure the resistance.

Thereby, the data acquisition part 163 acquires the mapping data D in which the measured values of the resistances of the measurement object 900 are associated with the positions corresponding to the multiple first electrodes 112. According to the embodiment, the positions of the measurement object 900 that correspond to the multiple first electrodes 112 correspond to the positions in the X-direction and the Y-direction of the multiple first electrodes 112.

However, the configuration of the measurement part 160 is not limited to that described above. For example, the number of the first terminals 161 may be less than the number of the first electrodes 112. Also, the number of the second terminals 162 may be less than the number of the second electrodes 122. In such a case, the surface distribution of the resistance may be sequentially measured by rerouting the first lead wire 193 and the second lead wire 194 from the first and second interconnects 132 and 142 that correspond to the pair of electrodes 112 and 122 for which the resistance has been measured to the first and second interconnects 132 and 142 that correspond to the pair of electrodes 112 and 122 for which the resistance is unmeasured.

As shown in FIG. 1, the controller 170 includes, for example, a processor 171 that includes a processor such as a CPU (Central Processing Unit) or the like, and a memory part 172 that includes memory such as ROM (Read Only Memory), RAM (Random Access Memory), etc.

The memory part 172 stores various programs, data, etc., for measuring the resistance of the measurement object 900. The processor 171 reads the programs stored in the memory part 172 and controls the pressing mechanism 151, the position adjustment mechanism 152, the measurement part 160, and the displayer 182 based on instructions that are input via the operation part 181 by a user. For example, the controller 170 can read recording media such as CD-ROM, DVD-ROM, a magneto-optical disk, flash memory, etc., and may acquire the programs from a recording medium. Also, the controller 170 may acquire the programs via a communication network such as the Internet, etc.

The operation part 181 is, for example, a keyboard, etc. The user can use the operation part 181 to input instructions such as the position adjustment between the first chip 110 and the second chip 120, the start of the resistance measurement, etc., to the controller 170.

According to the embodiment, the displayer 182 is, for example, a display. The mapping data D is displayed by the displayer 182.

However, the first wiring substrate 130, the second wiring substrate 140, the position adjustment mechanism 152, the controller 170, the operation part 181, and the displayer 182 may not be provided in the resistance mapping device 100.

Operations of the resistance mapping device 100 according to the embodiment will now be described. Namely, a resistance measurement method according to the embodiment will be described.

First, the user instructs the controller 170 via the operation part 181 to adjust the relative positions in the X-direction and the Y-direction of the first and second chips 110 and 120. Thereby, the controller 170 controls the position adjustment mechanism 152 to adjust the relative positions in the X-direction and the Y-direction of the first and second chips 110 and 120.

Specifically, the controller 170 controls the position adjustment mechanism 152 to move the first chip 110 in the X-direction and the Y-direction so that all of the first electrodes 112 face the corresponding second electrodes 122. At this time, the relative positions in the X-direction and the Y-direction of the first and second chips 110 and 120 may be adjusted by using a positioning jig. However, the method of adjusting the relative positions in the X-direction and the Y-direction of the first and second chips 110 and 120 is not limited to those described above.

Then, the user places the measurement object 900 on the second chip 120. Thereby, the measurement object 900 is disposed between the first chip 110 and the second chip 120.

Then, the user instructs the controller 170 via the operation part 181 to measure the surface distribution of the resistance of the measurement object 900.

Thereby, first, the processor 171 of the controller 170 controls the pressing mechanism 151 to move the first wiring substrate 130 and the first chip 110 in the downward direction and to press the multiple first electrodes 112 and the multiple second electrodes 122 onto the measurement object 900. Thereby, the electrodes 112 and 122 press the measurement object 900.

There is a possibility that the measurement accuracy of the resistance of the measurement object 900 may degrade when the contact area between the measurement object 900 and the pair of electrodes 112 and 122 is small because the contact resistance between the measurement object 900 and the electrodes 112 and 122 is large. The contact resistance between the measurement object 900 and the electrodes 112 and 122 can be suppressed by sufficiently pressing the electrodes 112 and 122 onto the measurement object 900.

The contact resistance gradually decreases as the pressure of the electrodes 112 and 122 on the measurement object 900 is gradually increased; accordingly, a current that flows between the pair of electrodes 112 and 122 gradually increases. Then, when the pressure is in a range that is not less than a prescribed value, the value of the current flowing between the pair of electrodes 112 and 122 becomes substantially constant even as the pressure is gradually increased because the contact resistance is sufficiently small.

Therefore, according to the embodiment, the controller 170 controls the measurement part 160 and the pressing mechanism 151, measures the current between each pair of electrodes 112 and 122, and increases the pressure of the electrodes 112 and 122 until the measured value of the current saturates for each pair of electrodes 112 and 122. "The measured value of the current being saturated" means practically saturated and does not mean that the measured value of the current is exactly constant. Accordingly, the measured value may be considered to be saturated if the change amount of the measured value of the current is not more than a prescribed value when the pressure is increased a prescribed amount.

However, the pressing mechanism 151 may not continue to increase the pressure until the measured value of the current is saturated. For example, when a prescribed pressure at which the contact resistance is sufficiently small is known, the pressing mechanism 151 may press the first wiring substrate 130 and the second wiring substrate 140 with the prescribed pressure from the beginning. The prescribed pressure is, for example, 200 N.

Then, the processor 171 of the controller 170 controls the measurement part 160 to measure the resistance between each pair of electrodes 112 and 122. Specifically, the data acquisition part 163 of the measurement part 160 applies a prescribed voltage between each pair of electrodes 112 and 122 and measures the current that flows between each pair of electrodes 112 and 122. Then, the data acquisition part 163 calculates the resistance of the portion of the measurement object 900 between each pair of electrodes 112 and 122 from the prescribed voltage and the measured current for each pair of electrodes 112 and 122. Thereby, the data acquisition part 163 acquires the mapping data D in which the measured values of the resistances are associated with the positions of the measurement object 900 corresponding to the multiple first electrodes 112, i.e., the positions in the X-direction and the Y-direction of the multiple first electrodes 112.

According to the embodiment, the data acquisition part 163 simultaneously performs the measurement of the resistance of the portion of the measurement object 900 between each pair of electrodes 112 and 122. However, the measurement of the resistance of the portion of the measurement object 900 may not be performed simultaneously between each pair of electrodes 112 and 122. For example, the data acquisition part 163 may sequentially measure the resistances of the portions of the measurement object 900 between the pairs of electrodes 112 and 122.

Figure 5:
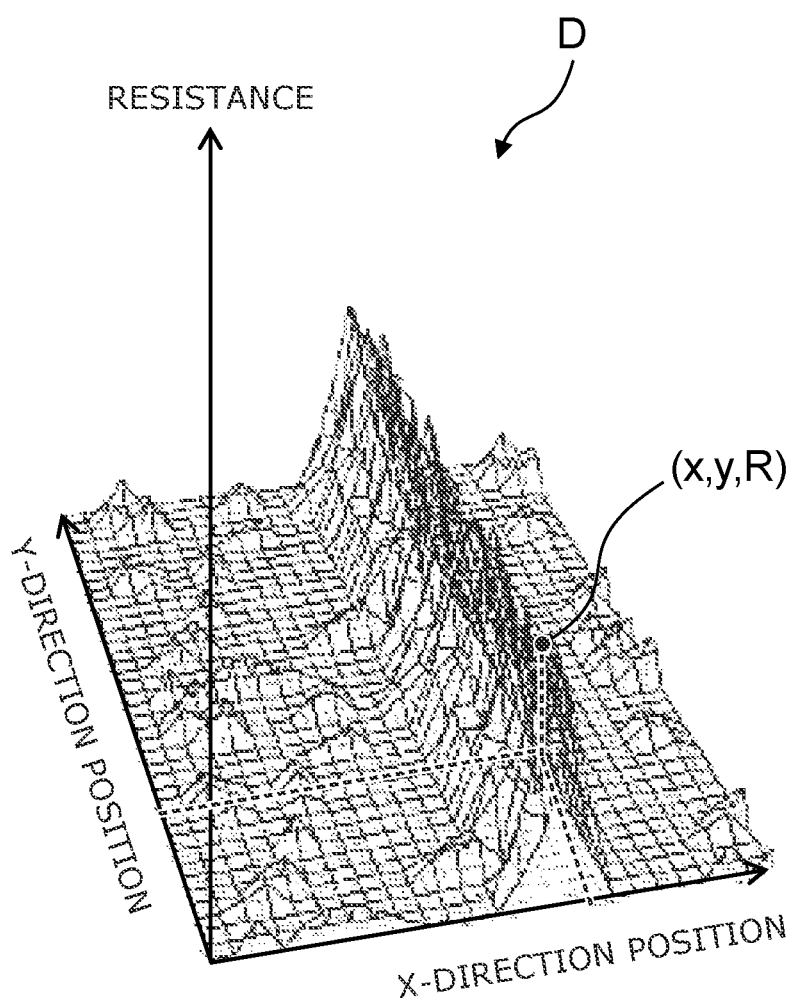
FIG. 5 is a graph illustrating mapping data that is acquired by the resistance mapping device according to the first embodiment, in which a first axis is a X-direction position, a second axis that is orthogonal to the first axis is a Y-direction position, and a third axis that is orthogonal to the first and second axes is the resistance.

FIG. 5 is a graph illustrating mapping data that is acquired by the resistance mapping device according to the embodiment, in which a first axis is the X-direction position, a second axis that is orthogonal to the first axis is the Y-direction position, and a third axis that is orthogonal to the first and second axes is the resistance.

Then, the controller 170 controls the displayer 182 to display the mapping data D. According to the embodiment, the mapping data D is data in which measured values R of the resistances at the positions (x, y) are associated with the positions (x, y) in the X-direction and the Y-direction of the multiple first electrodes 112. As shown in FIG. 5, it can be estimated that a defect such as the void 901, deterioration that is different from the surroundings, or the like has occurred in the region in which the measured values R of the resistances are high compared to the other regions.

Effects according to the embodiment will now be described.

The resistance mapping device 100 according to the embodiment includes the first chip 110, the second chip 120, and the measurement part 160. The first chip 110 includes a first surface (the lower surface 111b), and a second surface (the upper surface 111a) that is positioned at the side opposite to the first surface; the multiple first electrodes 112 are located at the first surface. The second chip 120 includes a third surface (the upper surface 121a) that faces the first surface, and a fourth surface (121b) that is positioned at the side opposite to the third surface; the multiple second electrodes 122 that correspond to the multiple first electrodes 112 are located at the third surface. The measurement part 160 is electrically connected to the multiple first electrodes 112 and the multiple second electrodes 122, is configured to measure the resistance of the portion of the measurement object 900 between the first electrode 112 of the multiple first electrodes 112 and the second electrode 122 of the multiple second electrodes 122 that correspond to each other in a state in which the measurement object 900 is disposed between the first chip 110 and the second chip 120, and is configured to acquire the mapping data D in which the measured values R of the resistances are associated with the positions of the measurement object 900 corresponding to the multiple first electrodes 112. Thus, the resistance mapping device 100 that is configured to measure the surface distribution of the resistance of the measurement object 900 can be realized.

The multiple first electrodes 112 are included in the first chip 110 that is a semiconductor element; and the multiple second electrodes 122 are included in the second chip 120 that is a semiconductor element. Therefore, the surface distribution of the resistance can be measured with a high surface density.

The resistance mapping device 100 includes the position adjustment mechanism 152 that adjusts the relative positions of the multiple first electrodes 112 and the multiple second electrodes 122. Therefore, misalignment of the multiple second electrodes 122 with respect to the multiple first electrodes 112 in a direction orthogonal to the direction from the first chip 110 toward the second chip 120 can be suppressed.

The first chip 110 includes the multiple first through-electrodes 113 that are electrically connected to the multiple first electrodes 112 and extend in the direction from the first surface (the lower surface 111b) toward the second surface (the upper surface 111a). Therefore, the multiple first electrodes 112 can be connected to the measurement part 160 via the multiple first through-electrodes 113.

The resistance mapping device 100 includes the first wiring substrate 130 that is mounted to the second surface (the upper surface 111a), includes the multiple first interconnects 132 that can electrically connect the measurement part 160 and the multiple first through-electrodes 113, and has a surface area when viewed in plan that is greater than the surface area of the first chip 110 when viewed in plan. Therefore, the multiple first electrodes 112 can be easily connected to the measurement part 160 via the multiple first wiring substrates 130.

The second chip 120 includes the multiple second through-electrodes 123 that are electrically connected to the multiple second electrodes 122 and extend in the direction from the third surface (the upper surface 121a) toward the fourth surface (the lower surface 121b). Therefore, the multiple second electrodes 122 can be connected to the measurement part 160 via the multiple second through-electrodes 123.

The resistance mapping device 100 includes the second wiring substrate 140 that is mounted to the fourth surface (the lower surface 121b), includes the multiple second interconnects 142 that can electrically connect the measurement part 160 and the multiple second through-electrodes 123, and has a surface area when viewed in plan that is greater than the surface area of the second chip 120 when viewed in plan. Therefore, the multiple second electrodes 122 can be easily connected to the measurement part 160 via the multiple second wiring substrates 140.

The multiple first electrodes 112 and the multiple second electrodes 122 each are bumps. Therefore, the surface distribution of the resistance can be measured with a high surface density.

The resistance measurement method according to the embodiment includes a step of disposing the measurement object 900 between the first chip 110 and the second chip 120, and a step of measuring the resistance of the portion of the measurement object 900 between one of the multiple first electrodes 112 and one of the multiple second electrodes 122 and the resistance of the portion of the measurement object 900 between another one of the multiple first electrodes 112 and another one of the multiple second electrodes 122. Accordingly, according to the resistance measurement method according to the embodiment, the resistance distribution of the measurement object 900 can be efficiently acquired.

A program according to the embodiment is configured to cause a processor to perform a step of measuring the resistance of a portion of a measurement object between one of the multiple first electrodes and one of the multiple second electrodes and the resistance of a portion of the measurement object between another one of the multiple first electrodes 112 and another one of the multiple second electrodes 122 in a state in which the measurement object is disposed between the first chip and the second chip. Accordingly, the resistance distribution of the measurement object 900 can be efficiently acquired according to the resistance measurement program according to the embodiment.

A recording medium according to the embodiment stores the program described above. Therefore, the resistance distribution of the measurement object 900 can be efficiently acquired according to the recording medium according to the embodiment.

Second Embodiment

A second embodiment will now be described.

Figure 6:
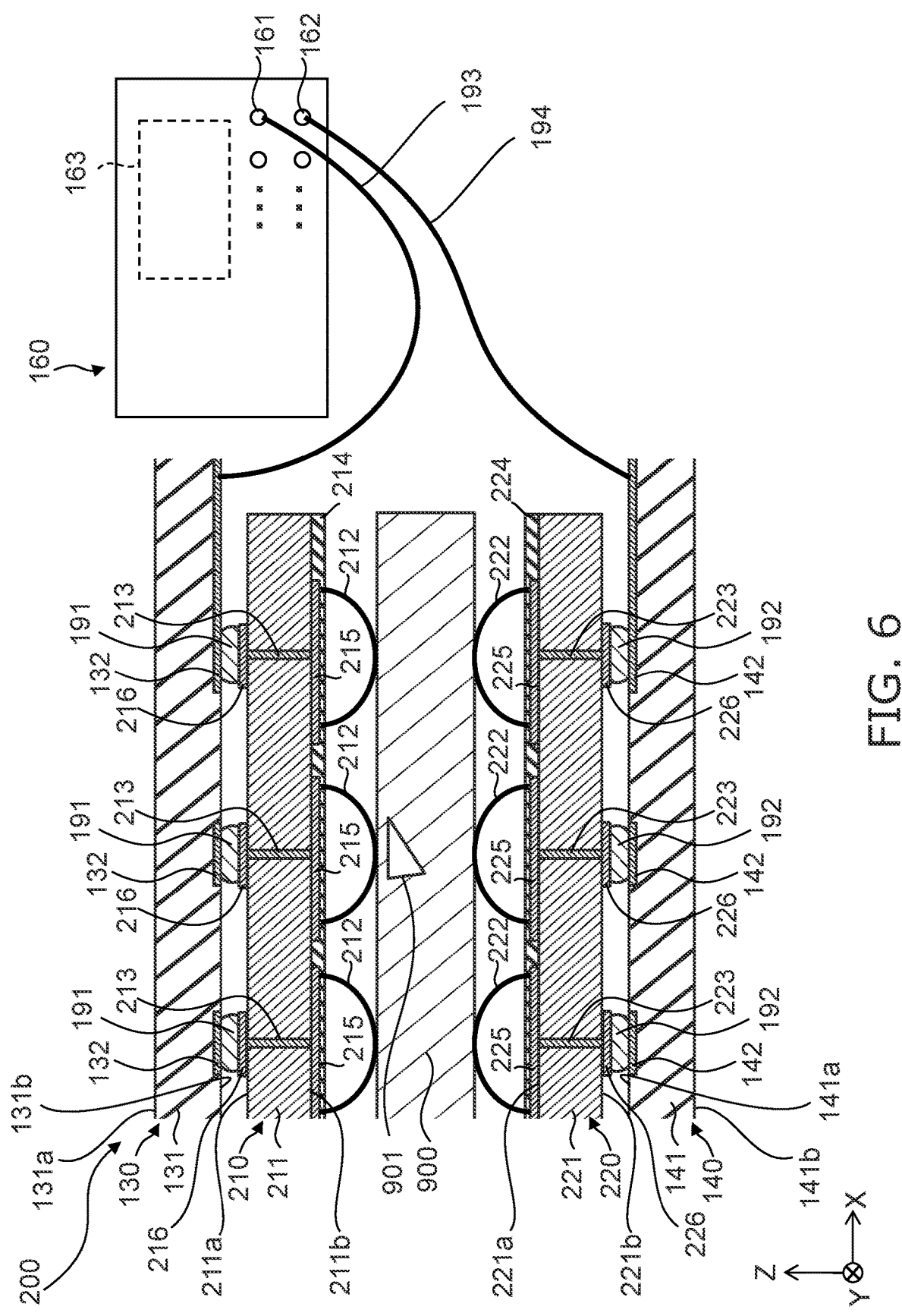
FIG. 6 is a partial end view showing a resistance mapping device according to a second embodiment.

FIG. 6 is a partial end view showing a resistance mapping device according to the embodiment.

The configurations of a first electrode 212 and a second electrode 222 of the resistance mapping device 200 (the resistance measuring device 200) according to the embodiment are different from those of the resistance mapping device 100 according to the first embodiment.

As a general rule in the following description, only the differences with the first embodiment are described. Other than the items described below, the embodiment is similar to the first embodiment.

A first chip 210 is a semiconductor element. The first chip 210 includes a substrate 211, the multiple first electrodes 212, multiple first through-electrodes 213, and a cover layer 214.

For example, the substrate 211 is made of a semiconductor material such as silicon, etc. The surfaces of the substrate 211 include an upper surface 211*a* and a lower surface 211*b*. The upper surface 211*a* is parallel to the X-direction and the Y-direction. The lower surface 211*b* is positioned at the side opposite to the upper surface 211*a*. The lower surface 211*b* is parallel to the X-direction and the Y-direction. The multiple first electrodes 212 are disposed at the lower surface 211*b*. The multiple first through-electrodes 213 that extend through the substrate 211 in the thickness direction are provided in the substrate 211 to correspond to the multiple first electrodes 212. The number of the first through-electrodes 213 is equal to the number of the first electrodes 212.

Figure 7:
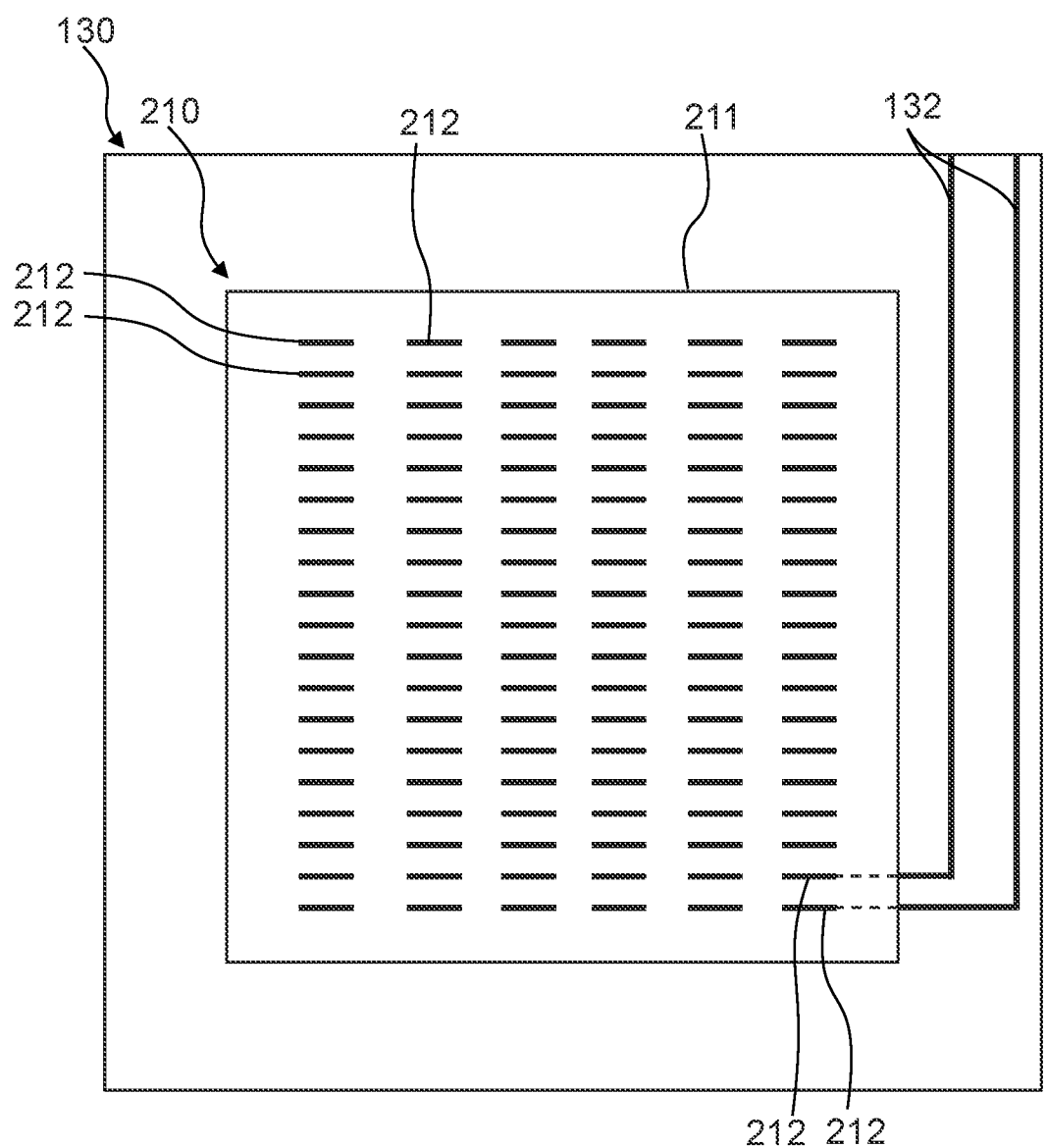
FIG. 7 is a plan view showing a first chip and a first wiring substrate of the resistance mapping device according to the second embodiment.
Figure 7:
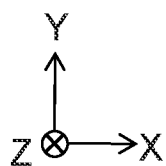

FIG. 7 is a plan view showing the first chip and the first wiring substrate of the resistance mapping device according to the embodiment.

Each first electrode 212 is made of a conductive material such as a copper alloy, etc. According to the embodiment, each first electrode 212 is a wire. Each first electrode 212 extends along the X-direction when viewed in plan. According to the embodiment, the multiple first electrodes 212 are arranged at substantially uniform spacing in the X-direction and the Y-direction. The multiple first electrodes 212 are separated from each other. However, each first electrode 212 may extend in the Y-direction.

As shown in FIG. 6, the two X-direction ends of each first electrode 212 are bonded to the lower surface 211*b* of the substrate 211 by a conductive bonding member 215. The portion between the two X-direction ends of each first electrode 212 is curved in a convex shape in the direction away from the substrate 211.

Each first through-electrode 213 is made of a conductive material such as copper, etc. The multiple first through-electrodes 213 are electrically connected respectively to the multiple first electrodes 212. Each first through-electrode 213 extends from the lower surface 211*b* toward the upper surface 211*a* of the substrate 211. The lower end of each first through-electrode 213 contacts the bonding member 215 that is bonded to the corresponding first electrode 212. The upper end of each first through-electrode 213 contacts a conductive member 216. Each first through-electrode 213 is electrically connected to the corresponding first interconnect 132 of the first wiring substrate 130 via the bonding member 191 and the conductive member 216. The multiple first through-electrodes 213 are separated from each other.

The cover layer 214 covers the lower surface 211*b* of the substrate 211. For example, the cover layer 214 is made of a resin material.

A second chip 220 is a semiconductor element. The second chip 220 is disposed below the first chip 210. The measurement object 900 is disposed between the first chip 210 and the second chip 220. The second chip 220 includes a substrate 221, the multiple second electrodes 222, multiple second through-electrodes 223, and a cover layer 224.

For example, the substrate 221 is made of a semiconductor material such as silicon, etc. The surfaces of the substrate 221 include an upper surface 221*a* and a lower surface 221*b*. The upper surface 221*a* is parallel to the X-direction and the Y-direction. The upper surface 221*a* faces the lower surface 211*b* of the first chip 210. The multiple second electrodes 222 that correspond to the multiple first electrodes 212 are located at the upper surface 221*a*. The number of the second electrodes 222 is equal to the number of the first electrodes 212. The lower surface 221*b* is positioned at the side opposite to the upper surface 221*a*. The lower surface 221*b* is parallel to the X-direction and the Y-direction. The multiple second through-electrodes 223 that extend through the substrate 221 in the thickness direction are provided in the substrate 221 to correspond to the multiple second electrodes 222. The number of the second through-electrodes 223 is equal to the number of the second electrodes 222.

Figure 8:
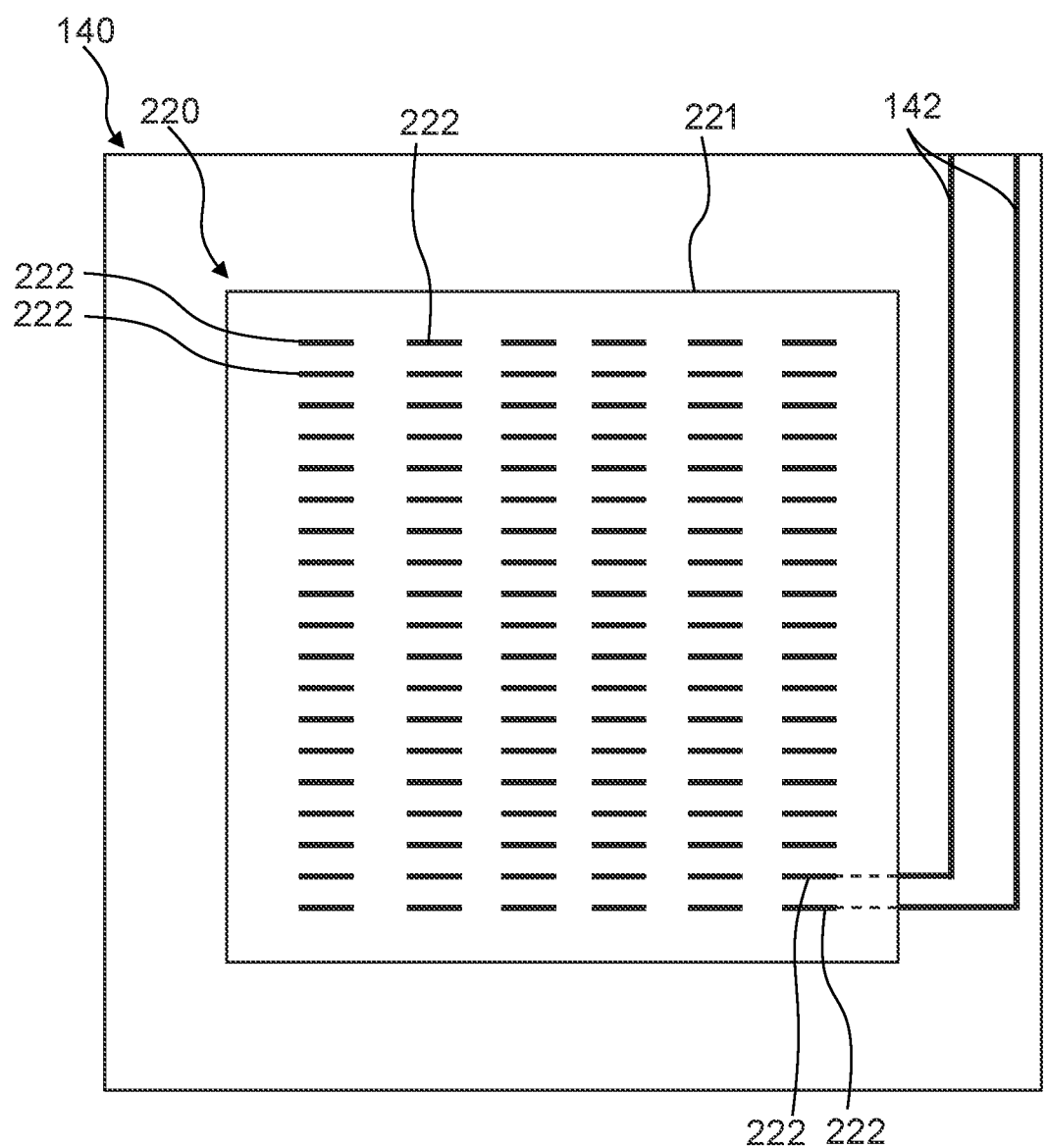
FIG. 8 is a plan view showing a second chip and a second wiring substrate of the resistance mapping device according to the second embodiment.

FIG. 8 is a plan view showing the second chip and the second wiring substrate of the resistance mapping device according to the embodiment.

Each second electrode 222 is made of a conductive material such as a copper alloy, etc. According to the embodiment, each second electrode 222 is a wire. According to the embodiment, each second electrode 222 extends along the X-direction when viewed in plan. Similarly to the multiple first electrodes 212, the multiple second electrodes 222 are arranged at substantially uniform spacing in the X-direction and the Y-direction. The multiple second electrodes 222 are separated from each other. However, each second electrode 222 may extend in the Y-direction.

As shown in FIG. 6, the two X-direction ends of each second electrode 222 are bonded to the upper surface 221*a* of the substrate 221 by a conductive bonding member 225. The portion between the two X-direction ends of each second electrode 222 is curved in a convex shape in the direction away from the substrate 221.

Each second through-electrode 223 is made of a conductive material such as copper, etc. The multiple second through-electrodes 223 are electrically connected respectively to the multiple second electrodes 222. Each second through-electrode 223 extends from the upper surface 221*a* toward the lower surface 221*b* of the substrate 221. The upper end of each second through-electrode 223 contacts the bonding member 225 that is bonded to the corresponding second electrode 222. The lower end of each second through-electrode 223 contacts a conductive member 226. Each second through-electrode 223 is electrically connected to the corresponding second interconnect 142 of the second wiring substrate 140 via the bonding member 192 and the conductive member 226. The multiple second through-electrodes 223 are separated from each other.

The cover layer 224 covers the upper surface 221*a* of the substrate 221. For example, the cover layer 224 is made of a resin material.

Effects according to the embodiment will now be described.

According to the embodiment, the multiple first electrodes 212 and the multiple second electrodes 222 each are wires. Therefore, each first electrode 212 and each second electrode 222 can be caused to sufficiently contact the surfaces of the measurement object 900 by pressing the multiple first electrodes 212 and the multiple second electrodes 222 onto the measurement object 900.

Third Embodiment

A third embodiment will now be described.

Figure 9:
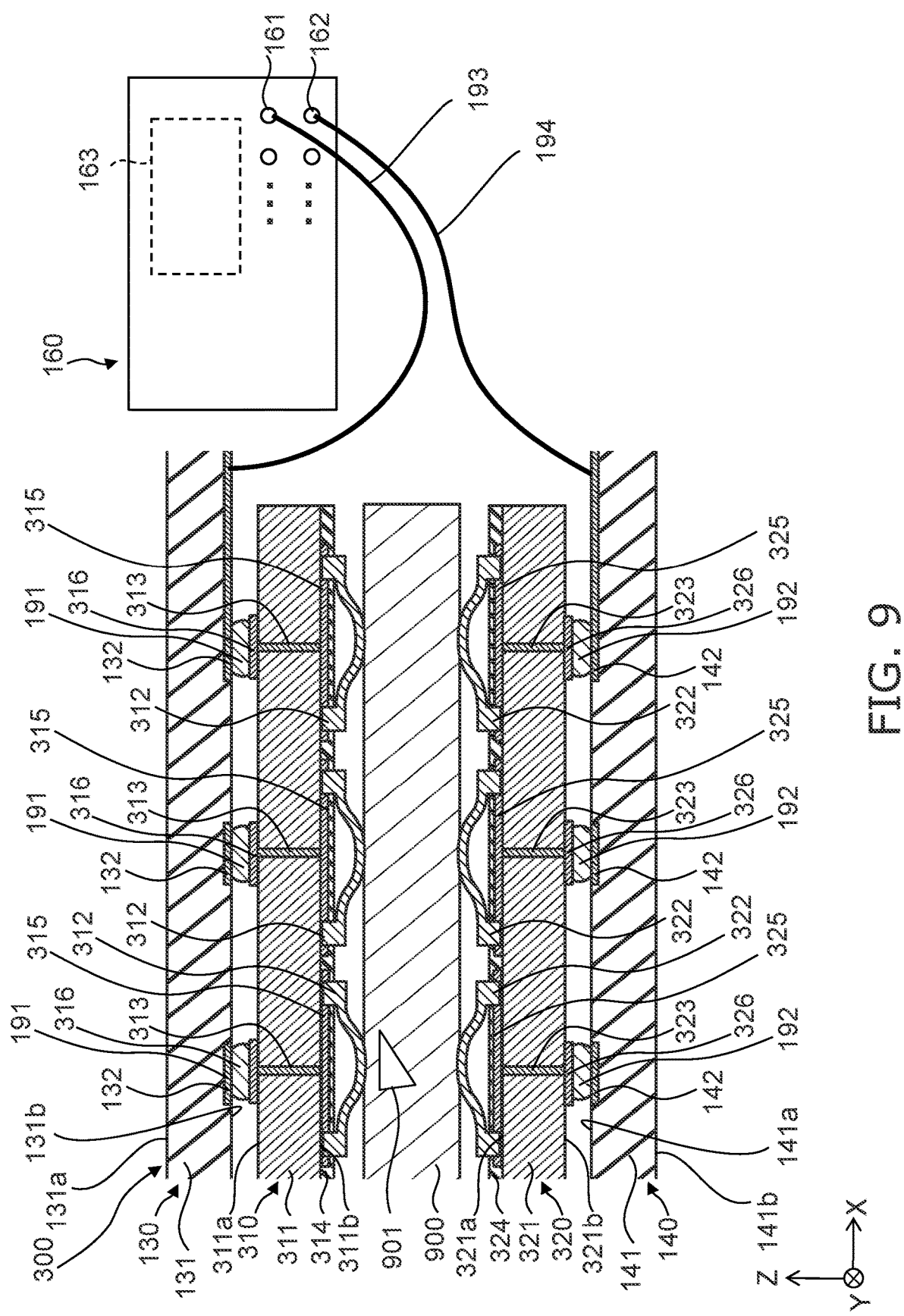
FIG. 9 is a partial end view showing a resistance mapping device according to a third embodiment.

FIG. 9 is a partial end view showing a resistance mapping device according to the embodiment.

The configurations of a first electrode 312 and a second electrode 322 of the resistance mapping device 300 (the resistance measuring device 300) according to the embodiment are different from those of the resistance mapping device 100 according to the first embodiment.

A first chip 310 is a semiconductor element. The first chip 310 includes a substrate 311, the multiple first electrodes 312, multiple first through-electrodes 313, and a cover layer 314.

For example, the substrate 311 is made of a semiconductor material such as silicon, etc. The surfaces of the substrate 311 include an upper surface 311a and a lower surface 311b. The upper surface 311a is parallel to the X-direction and the Y-direction. The lower surface 311b is positioned at the side opposite to the upper surface 311a. The lower surface 311b is parallel to the X-direction and the Y-direction. The multiple first electrodes 312 are disposed at the lower surface 311b. The multiple first through-electrodes 313 that extend through the substrate 311 in the thickness direction are provided in the substrate 311 to correspond to the multiple first electrodes 312. The number of the first through-electrodes 313 is equal to the number of the first electrodes 312.

Each first electrode 312 is made of a conductive material such as a copper alloy, etc. According to the embodiment, each first electrode 312 is a plate spring or a MEMS (Micro Electro Mechanical System). According to the embodiment, each first electrode 312 extends in the X-direction when viewed in plan. The two X-direction ends of each first electrode 312 are bonded to the lower surface 311b of the substrate 311 by a conductive bonding member 315. The portion between the two ends of each first electrode 312 is curved in a convex shape in the direction away from the substrate 311.

According to the embodiment, the multiple first electrodes 312 are arranged at substantially uniform spacing in the X-direction and the Y-direction. The multiple first electrodes 312 are separated from each other.

As shown in FIG. 9, each first through-electrode 313 is made of a conductive material such as copper, etc. The multiple first through-electrodes 313 are connected respectively to the multiple first electrodes 312. Each first through-electrode 313 extends from the lower surface 311b toward the upper surface 311a of the substrate 311. The lower end of each first through-electrode 313 contacts the bonding member 315 that is bonded to the corresponding first electrode 312. The upper end of each first through-electrode 313 contacts a conductive member 316. Each first through-electrode 313 is electrically connected to the corresponding first interconnect 132 of the first wiring substrate 130 via the bonding member 191 and the conductive member 316. The multiple first through-electrodes 313 are separated from each other.

The cover layer 314 covers the lower surface 311b of the substrate 311. For example, the cover layer 314 is made of a resin material.

A second chip 320 is disposed below the first chip 310. The measurement object 900 is disposed between the first chip 310 and the second chip 320. The second chip 320 includes a substrate 321, the multiple second electrodes 322, multiple second through-electrodes 323, and a cover layer 324.

For example, the substrate 321 is made of a semiconductor material such as silicon, etc. The surfaces of the substrate 321 include an upper surface 321a and a lower surface 321b. The upper surface 321a is parallel to the X-direction and the Y-direction. The upper surface 321a faces the lower surface 311b of the first chip 310. The multiple second electrodes 322 that correspond to the multiple first electrodes 312 are located at the upper surface 321a. Accordingly, the number of the second electrodes 322 is equal to the number of the first electrodes 312. The lower surface 321b is positioned at the side opposite to the upper surface 321a. The lower surface 321b is parallel to the X-direction and the Y-direction. The multiple second through-electrodes 323 that extend through the substrate 321 in the thickness direction are provided in the substrate 321 to correspond to the multiple second electrodes 322. Accordingly, the number of the second through-electrodes 323 is equal to the number of the second electrodes 322.

Each second electrode 322 is made of a conductive material such as a copper alloy, etc. According to the embodiment, each second electrode 322 is a plate spring or a MEMS. According to the embodiment, each second electrode 322 extends in the X-direction when viewed in plan. The two X-direction ends of each second electrode 322 are bonded to the upper surface 321a of the substrate 321 by a conductive bonding member 325. The portion between the two X-direction ends of each second electrode 322 is curved in a convex shape in the direction away from the substrate 321.

Similarly to the multiple first electrodes 312, the multiple second electrodes 322 are arranged at substantially uniform spacing in the X-direction and the Y-direction. The multiple second electrodes 322 are separated from each other.

As shown in FIG. 9, each second through-electrode 323 is made of a conductive material such as copper, etc. The multiple second through-electrodes 323 are electrically connected respectively to the multiple second electrodes 322. Each second through-electrode 323 extends from the lower surface 321b toward the upper surface 321a of the substrate 321. The upper end of each second through-electrode 323 contacts the bonding member 325 that is bonded to the corresponding second electrode 322. The lower end of each second through-electrode 323 contacts a conductive member 326. Each second through-electrode 323 is electrically connected to the corresponding second interconnect 142 of the second wiring substrate 140 via the bonding member 192 and the conductive member 326. The multiple second through-electrodes 323 are separated from each other.

The cover layer 324 covers the upper surface 321a of the substrate 321. For example, the cover layer 324 is made of a resin material.

Effects according to the embodiment will now be described.

According to the embodiment, the multiple first electrodes 312 and the multiple second electrodes 322 each are a plate spring or a MEMS. Therefore, each first electrode 312 and each second electrode 322 can be caused to have slight elastic deformation or mechanical deformation by pressing the multiple first electrodes 312 and the multiple second electrodes 322 onto the measurement object 900. Thereby, each first electrode 312 and each second electrode 322 can be caused to sufficiently contact the surfaces of the measurement object 900.

Fourth Embodiment

A fourth embodiment will now be described.

Figure 10:
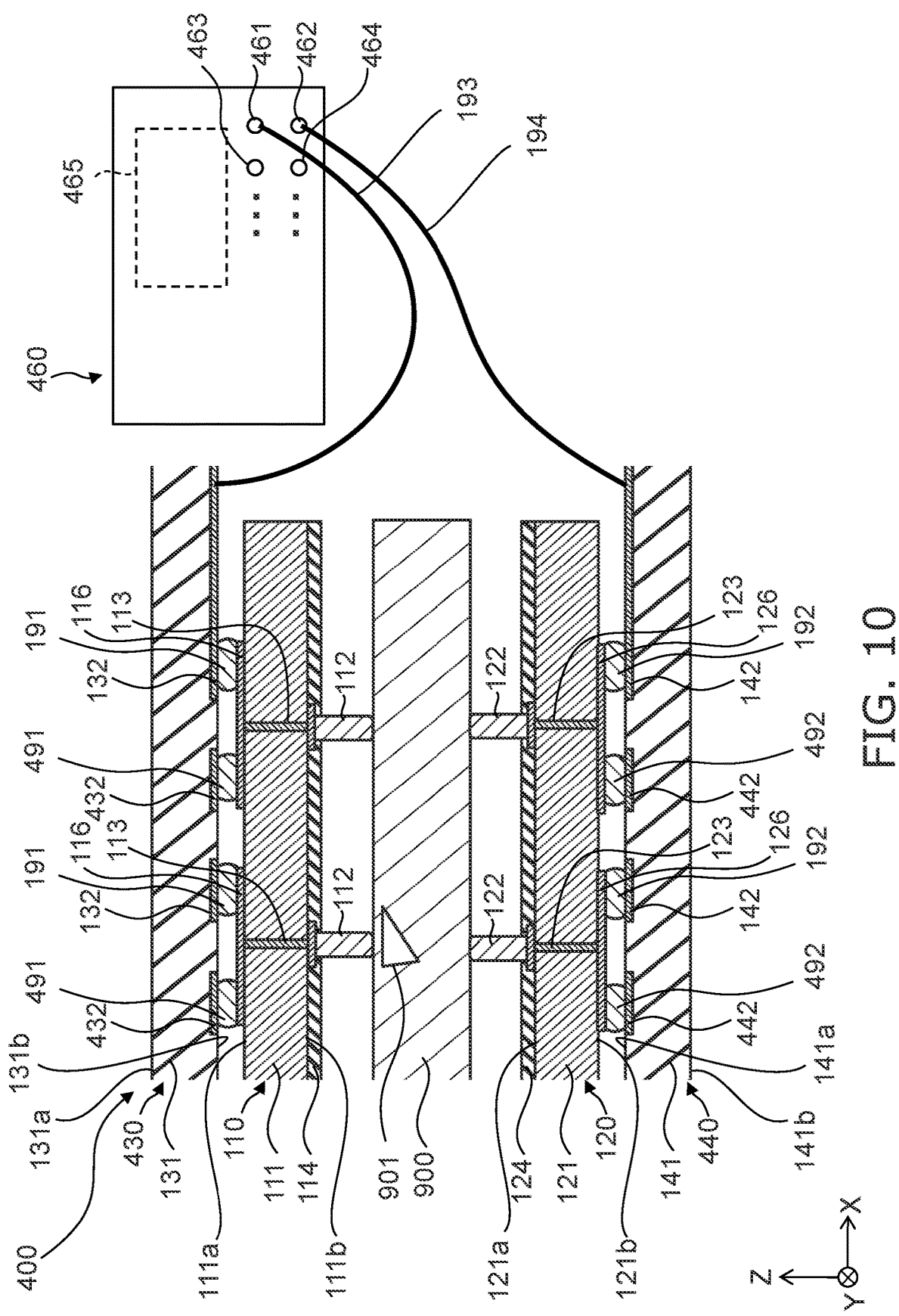
FIG. 10 is a partial end view showing a resistance mapping device according to a fourth embodiment.

FIG. 10 is a partial end view showing a resistance mapping device according to the embodiment.

The configuration of a first wiring substrate 430, the configuration of a second wiring substrate 440, and the configuration of a measurement part 460 of the resistance mapping device 400 (the resistance measuring device 400) according to the embodiment are different from those of the resistance mapping device 100 according to the first embodiment.

In addition to the configuration of the first wiring substrate 130 according to the first embodiment, the first wiring substrate 430 further includes multiple third interconnects 432 that correspond to the multiple first through-electrodes 113.

Each third interconnect 432 is electrically connected to the corresponding first through-electrode 113 via the conductive member 116 and a conductive bonding member 491 such as solder, etc. In other words, the first interconnect 132 and the third interconnect 432 are electrically connected to one first electrode 112.

In addition to the configuration of the second wiring substrate 140 according to the first embodiment, the second wiring substrate 440 further includes multiple fourth interconnects 442 that correspond to the multiple second through-electrodes 123.

Each fourth interconnect 442 is electrically connected to the corresponding second through-electrode 123 via the conductive member 126 and a conductive bonding member 492 such as solder, etc. In other words, the second interconnect 142 and the fourth interconnect 442 are electrically connected to one second electrode 122.

The measurement part 460 includes multiple first terminals 461 that correspond to the multiple first interconnects 132, multiple second terminals 462 that correspond to the multiple second interconnects 142, multiple third terminals 463 that correspond to the multiple third interconnects 432, multiple fourth terminals 464 that correspond to the multiple fourth interconnects 442, and a data acquisition part 465.

Each first terminal 461 is connected to the corresponding first interconnect 132 via the first lead wire 193. Each second terminal 462 is connected to the corresponding second interconnect 142 via the second lead wire 194. Each third terminal 463 is connected to the corresponding third interconnect 432 via a third lead wire that is not illustrated. Each fourth terminal 464 is connected to the corresponding fourth interconnect 442 via a fourth lead wire that is not illustrated.

Hereinbelow, the first terminal 461 and the second terminal 462 that are connected to the pair of electrodes 112 and 122 are called "the pair of terminals 461 and 462 for measuring the current"; and the third terminal 463 and the fourth terminal 464 that are connected to the pair of electrodes 112 and 122 are called the "pair of terminals 463 and 464 for measuring the voltage".

The data acquisition part 465 applies a prescribed voltage to each pair of terminals 461 and 462 for measuring the current and measures the current that flows between each pair of terminals 461 and 462 for measuring the current. Also, the data acquisition part 465 measures the voltage between each pair of terminals 463 and 464 for measuring the voltage. The data acquisition part 465 estimates the resistance of the portion of the measurement object 900 between each pair of electrodes 112 and 122 from the measured values of the currents and the measured values of the voltages. Thus, in the resistance mapping device 400 according to the embodiment, the resistance is measured by a four-terminal method. Therefore, the resistance can be measured with high accuracy.

Fifth Embodiment

A fifth embodiment will now be described.

Figure 11:
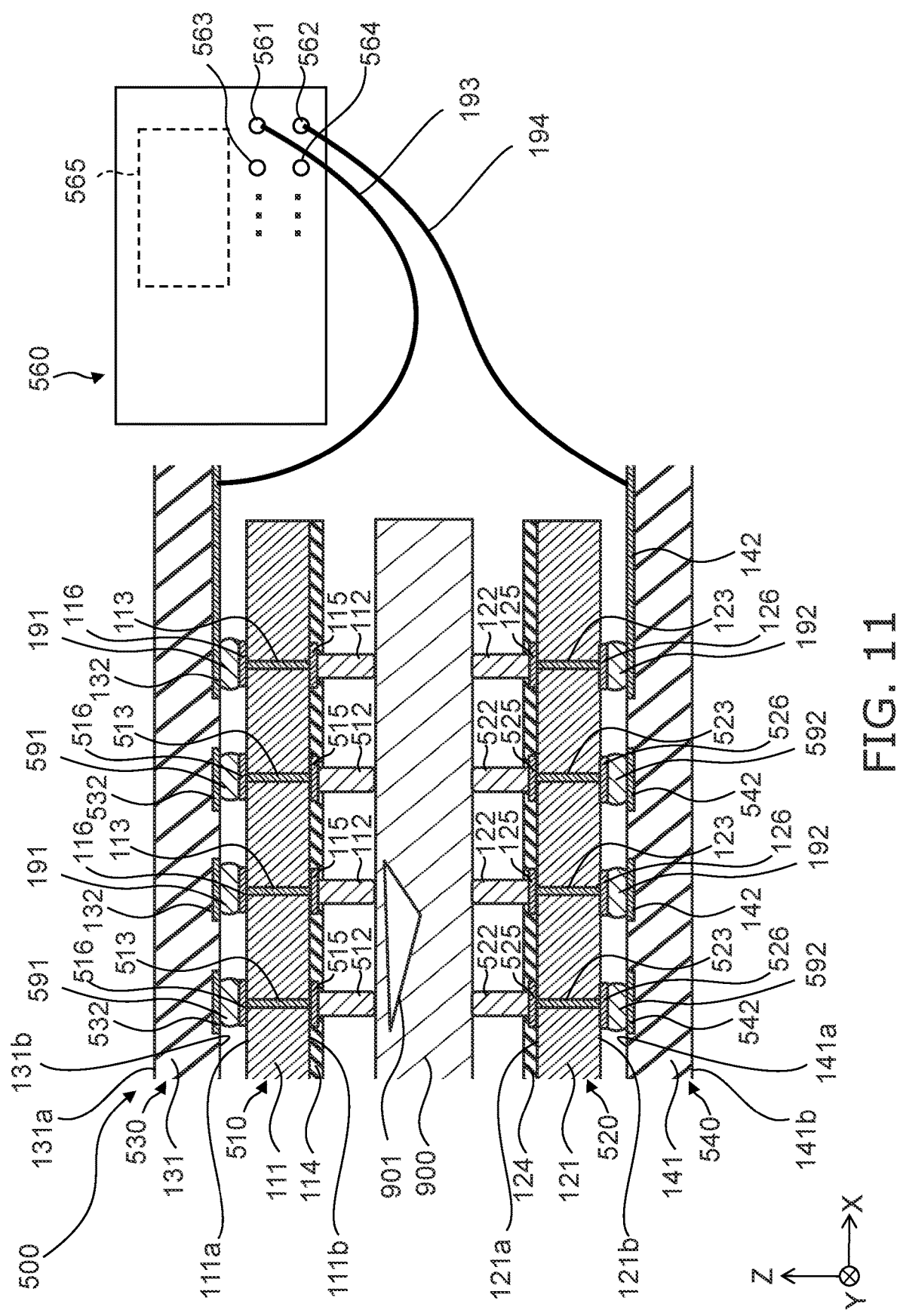
FIG. 11 is a partial end view showing a resistance mapping device according to a fifth embodiment.

FIG. 11 is a partial end view showing a resistance mapping device according to the embodiment.

The resistance mapping device 500 according to the embodiment differs from the resistance mapping device 100 according to the first embodiment in that third electrodes 512 are provided at a first chip 510, and fourth electrodes 522 are provided at a second chip 520.

In addition to the components of the first chip 110 according to the first embodiment, the first chip 510 further includes the multiple third electrodes 512 that correspond to the multiple first electrodes 112, and multiple third through-electrodes 513 that correspond to the multiple third electrodes 512.

The number of the third electrodes 512 is equal to the number of the first electrodes 112. Each third electrode 512 is located at the lower surface 111b of the substrate 111 and is next to the corresponding first electrode 112. According to the embodiment, each third electrode 512 is a bump and is made of a conductive material such as copper, etc.

The number of the third through-electrodes 513 is equal to the number of the third electrodes 512. Each third through-electrode 513 is made of a conductive material such as copper, etc. Each third through-electrode 513 extends in the Z-direction. The lower end of each third through-electrode 513 contacts a conductive member 515. Each third through-electrode 513 is electrically connected to the corresponding third electrode 512 via the conductive member 515. The upper end of each third through-electrode 513 contacts a conductive member 516.

In addition to the components of the second chip 120 according to the first embodiment, the second chip 520 further includes multiple fourth through-electrodes 523 and the multiple fourth electrodes 522 that correspond to the multiple third electrodes 512.

The number of the fourth electrodes 522 is equal to the number of the third electrodes 512. Each fourth electrode 522 is located at the upper surface 121a of the substrate 121 and is next to the corresponding second electrode 122. Each fourth electrode 522 faces the corresponding third electrode 512. According to the embodiment, each fourth electrode 522 is a bump and is made of a conductive material such as copper, etc.

The number of the fourth through-electrodes 523 is equal to the number of the fourth electrodes 522. Each fourth through-electrode 523 is made of a conductive material such as copper, etc. Each fourth through-electrode 523 extends in the Z-direction. The upper end of each fourth through-electrode 523 contacts a conductive member 525. Each fourth through-electrode 523 is electrically connected to the corresponding fourth electrode 522 via the conductive member 525. The lower end of each fourth through-electrode 523 contacts a conductive member 526.

In addition to the components of the first wiring substrate 130 according to the first embodiment, a first wiring substrate 530 further includes multiple third interconnects 532 that correspond to the multiple third through-electrodes 513. Each third interconnect 532 is electrically connected to the corresponding third through-electrode 513 via the conductive member 516 and a conductive bonding member 591.

In addition to the components of the second wiring substrate 140 according to the first embodiment, a second wiring substrate 540 further includes multiple fourth interconnects 542 that correspond to the multiple fourth through-electrodes 523. Each fourth interconnect 542 is electrically connected to the corresponding fourth through-electrode 523 via the conductive member 526 and a conductive bonding member 592.

A measurement part 560 includes multiple first terminals 561 that correspond to the multiple first interconnects 132, multiple second terminals 562 that correspond to the multiple second interconnects 142, multiple third terminals 563 that correspond to the multiple third interconnects 532, multiple fourth terminals 564 that correspond to the multiple fourth interconnects 542, and a data acquisition part 565.

Each first terminal 561 is connected to the corresponding first interconnect 132 via the first lead wire 193. Each second terminal 562 is connected to the corresponding second interconnect 142 via the second lead wire 194. Each third terminal 563 is connected to the corresponding third interconnect 532 via a third lead wire that is not illustrated. Each fourth terminal 564 is connected to the corresponding fourth interconnect 542 via the fourth lead wire that is not illustrated.

Hereinbelow, the first terminal 561 and the second terminal 562 that are connected to the pair of electrodes 112 and 122 are called "the pair of terminals 561 and 562 for measuring the current". The third terminal 563 and the fourth terminal 564 that are connected to the third and fourth electrodes 512 and 522 that correspond to the pair of electrodes 112 and 122 are called "the pair of terminals 563 and 564 for measuring the voltage".

The data acquisition part 565 applies a prescribed voltage to each pair of terminals 561 and 562 for measuring the current, and measures the current that flows between each pair of terminals 561 and 562 for measuring the current. Also, the data acquisition part 565 measures the voltage between each pair of terminals 563 and 564 for measuring the voltage. The data acquisition part 565 estimates the resistance of the portion of the measurement object 900 surrounded with the first electrode 112, the second electrode 122, the third electrode 512, and the fourth electrode 522 that correspond to each other from the measured values of the currents and the measured values of the voltages. Thus, in the resistance mapping device 500 according to the embodiment, the resistance is measured by a four-terminal method. Therefore, the resistance can be measured with high accuracy.

Effects according to the embodiment will now be described.

In the resistance mapping device 500 according to the embodiment, the first chip 510 further includes the third electrode 512 that is located at the first surface (the lower surface 111b) and is next to one first electrode 112 of the multiple first electrodes 112. The second chip 520 further includes the fourth electrode 522 that is located at the third surface (the upper surface 121a) and corresponds to the third electrode 512. The measurement part 560 measures the current between one first electrode 112 and one second electrode 122 of the multiple second electrodes 122 that corresponds to the one first electrode 112, measures the voltage between the third electrode 512 and the fourth electrode 522, and measures the resistance of the portion of the measurement object 900 surrounded with the one first electrode 112, the one second electrode 122, a third electrode 521, and the fourth electrode 522 based on the measured values of the currents and the measured values of the voltages. Thus, in the resistance mapping device 500 according to the embodiment, the resistance can be measured with high accuracy by using a four-terminal method.

An example is described in the first, second, and third embodiments in which the multiple second electrodes are not electrically connected to each other. However, the second chip may include interconnects that electrically connect the multiple second electrodes to each other. In such a case, the measurement part is configured to measure the resistances between all of the pairs of electrodes sequentially instead of simultaneously.

The measurement part may apply an alternating current voltage between the pair of electrodes and may measure the impedance.

A form is described in the first to fifth embodiments in which the resistance measuring devices 100, 200, 300, 400, and 500 acquire the mapping data D of the surface distribution of the resistance. However, the resistance measuring devices 100, 200, 300, 400, and 500 may not always acquire the mapping data D of the surface distribution of the resistance. In other words, for example, the resistance measuring devices 100, 200, 300, 400, and 500 may acquire an X-direction resistance distribution, a Y-direction resistance distribution, or a resistance distribution in a direction that crosses the X-direction and the Y-direction.

Sixth Embodiment

A sixth embodiment will now be described.

Figure 12A:
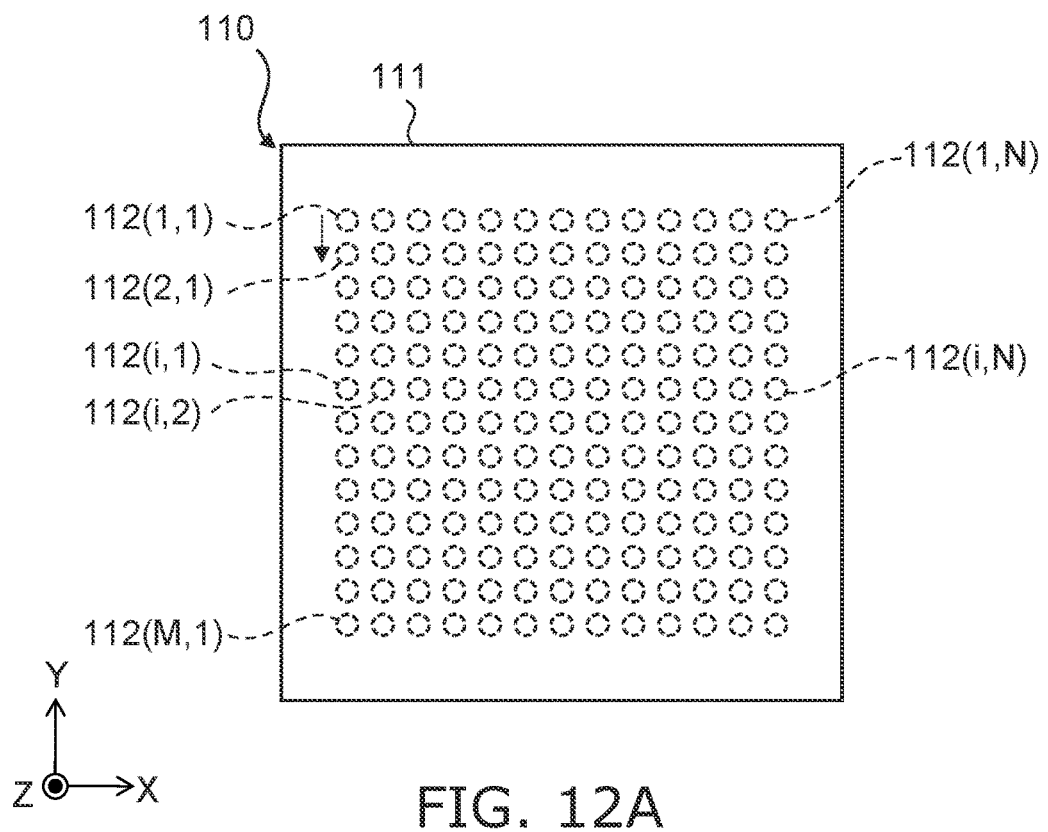
FIGS. 12A and 12B are schematic views showing a resistance measurement method according to a sixth embodiment.
Figure 12B:
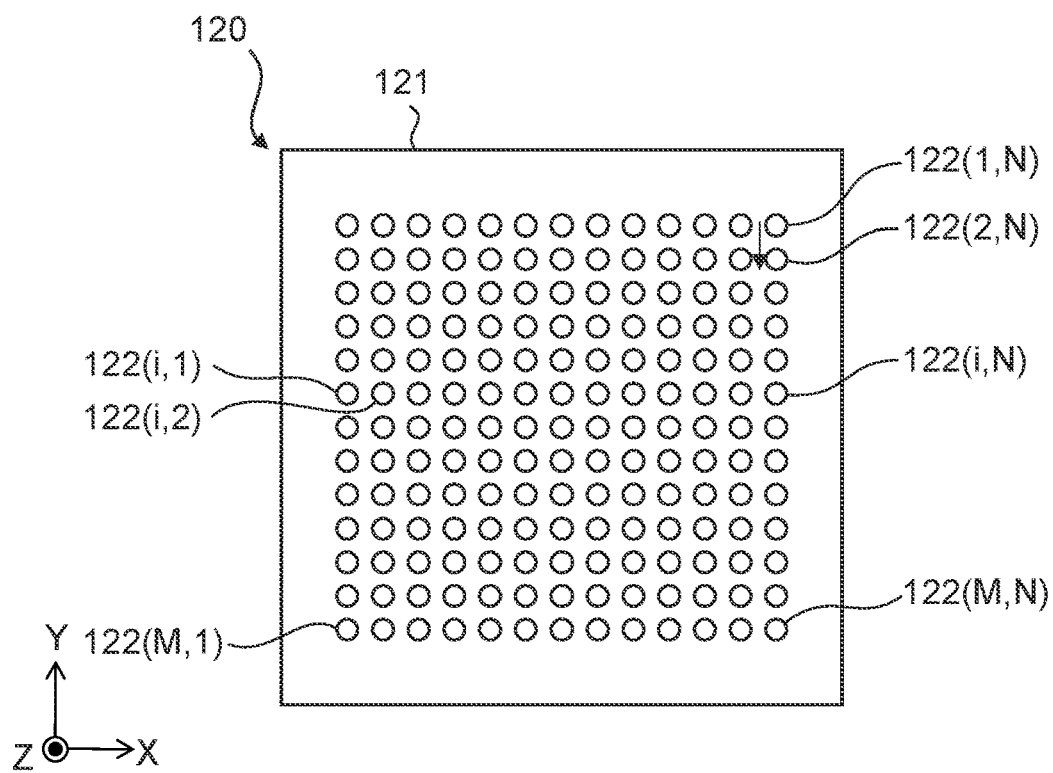

FIGS. 12A and 12B are schematic views showing a resistance measurement method according to the embodiment.

Figure 13:
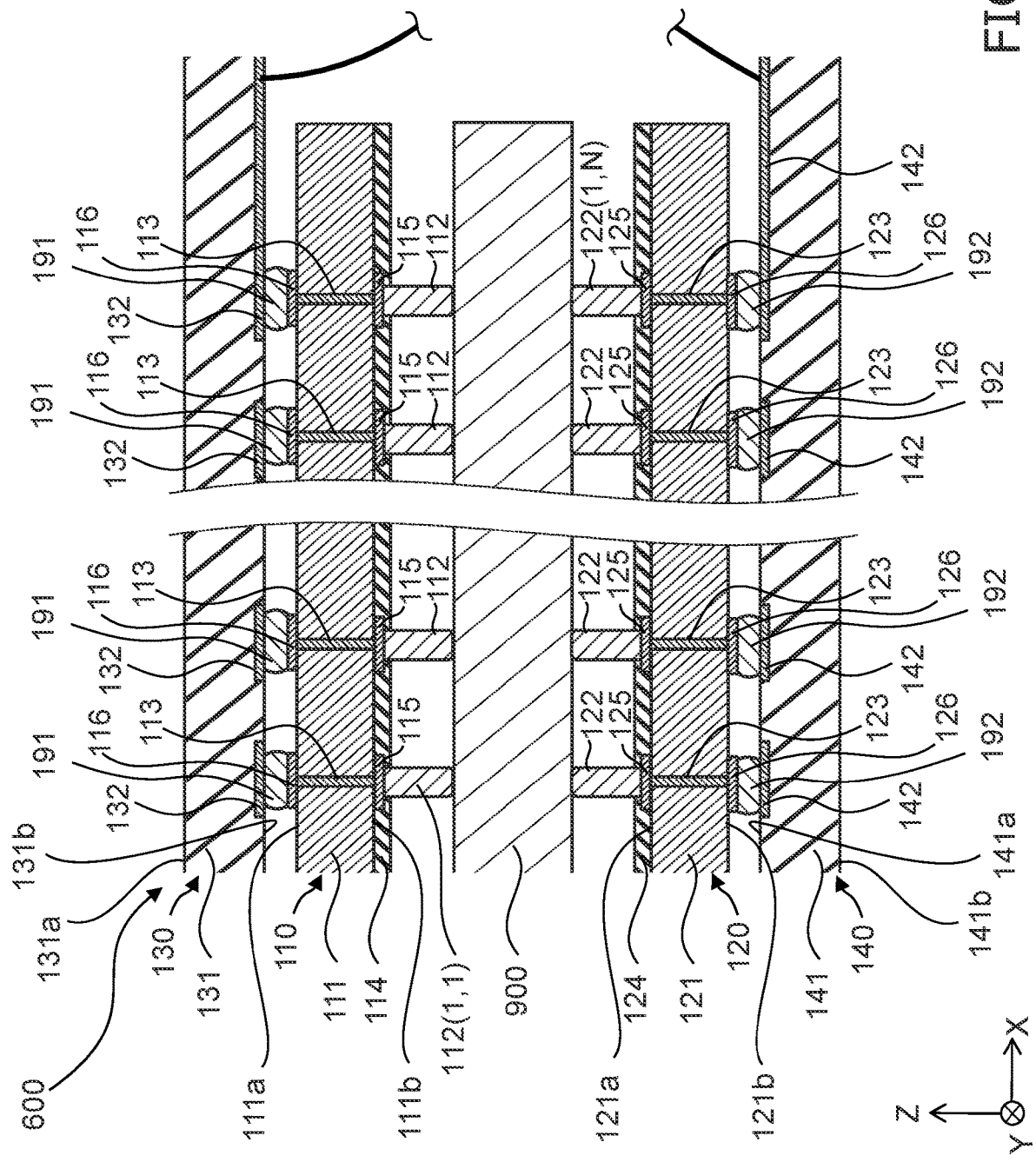
FIG. 13 is a partial end view showing a resistance measuring device according to the sixth embodiment.

FIG. 13 is a partial end view showing the resistance measuring device according to the embodiment.

The resistance measuring device 600 according to the embodiment differs from the resistance measuring device 100 according to the first embodiment in that the resistance of the portion of the measurement object 900 can be measured between any one of the multiple first electrodes 112 and any one of the multiple second electrodes 122 when viewed from above. The resistance measurement method according to the embodiment differs from the resistance measurement method according to the first embodiment in that the resistance of the portion of the measurement object 900 is measured between the first electrode 112 and the second electrode 122 that are disposed at positions that do not overlap each other when viewed from above among the multiple first electrodes 112 and the multiple second electrodes 122.

For easier understanding of the description hereinbelow, for the X-direction in FIGS. 12A and 12B, the side of the arrow is the "+X side"; and the opposite side is the "−X side". Similarly for the Y-direction, the side of the arrow is the "+Y side"; and the opposite side is taken as the "−Y side".

In a structure in which the components such as the multiple first electrodes 112, the multiple second electrodes 122, etc., are arranged in a lattice configuration, a component group that is arranged in the X-direction is called a "row"; and a component group that is arranged in the Y-direction is called a "column". When the total number of rows is M for each of the multiple first electrodes 112 and the multiple second electrodes 122, the row that is positioned furthest toward the +Y side in the Y-direction is taken as the "first row"; and the row that is positioned furthest toward the −Y side is taken as the "Mth row". When the total number of columns is N for each of the multiple first electrodes 112 and the multiple second electrodes 122, the column that is positioned furthest toward the −X side in the X-direction is taken as the "first column"; and the column that is positioned furthest toward the +X side is taken as the "Nth column". Hereinbelow, the first electrode 112 that is positioned at the ith row and the jth column is called the "first electrode 112 $(i, j)$". Similarly, the second electrode 122 that is positioned at the ith row and the jth column is called the "second electrode 122 $(i, j)$". Here, i is any integer from 1 to N; and j is any integer from 1 to M.

The processor 171 of the controller 170 controls the measurement part 160 to measure the resistance of the portion of the measurement object 900 positioned between the first electrode 112 $(1, 1)$ positioned at the first row and the first column and the second electrode 122 (1, N) positioned at the first row and the Nth column as shown in FIGS. 12A, 12B, and 13. In other words, the measurement part 160 measures the resistance between the first electrode 112 (1, 1) that is positioned furthest toward the −X side in the X-direction among the multiple first electrodes 112 and the second electrode 122 (1, N) that is positioned furthest toward the +X side in the X-direction among the multiple second electrodes 122.

Then, as shown in FIGS. 12A and 12B, the processor 171 controls the measurement part 160 to measure the resistance between the first electrode 112 (2, 1) and the second electrode 122 (2, N) that are shifted one row toward the −Y side.

Thus, the processor 171 controls the measurement part 160 to shift the portion of the measurement object 900 at which the resistance is measured one row at a time toward the −Y side and to measure the resistance of the portion between the first electrode 112 ($i$, 1) and the second electrode 122 ($i$, M) upon each shift.

Finally, the processor 171 controls the measurement part 160 to measure the resistance between the first electrode 112 (M, 1) positioned at the Mth row and the first column and the second electrode 122 (M, N) positioned at the Mth row and the Nth column. Thus, the measurement part 160 acquires the Y-direction resistance distribution in which the measured values of the resistances are associated with the positions in the Y-direction.

Then, the controller 170 displays the Y-direction resistance distribution in the displayer 182. When a position exists in the Y-direction at which the measured value of the resistance is greater than the measured values of the resistances of the other positions, the user can extract such a Y-direction position from the displayed Y-direction resistance distribution. The user may operate the operation part 181 to instruct the controller 170 to acquire the X-direction resistance distribution at the extracted Y-direction position.

Specifically, when such positions in the Y-direction correspond to the ith row of the N rows, the processor 171 of the controller 170 measures the resistance of the portion of the measurement object 900 between the first electrode 112 ($i$, 1) positioned at the ith row and the first column and the second electrode 122 ($i$, 1) positioned at the ith row and the first column. In other words, the measurement part 160 measures the resistance of the portion of the measurement object 900 between the first electrode 112 ($i$, 1) and the second electrode 122 ($i$, 1) that overlap each other when viewed in top-view.

Then, the processor 171 measures the resistance of the portion of the measurement object 900 between the first electrode 112 ($i$, 2) and the second electrode 122 ($i$, 2) that are shifted one column in the +X direction. Thus, the processor 171 controls the measurement part 160 to shift the portion of the measurement object 900 at which the resistance is measured one column at a time toward the +X side and to measure the resistance of the portion between the first electrode 112 ($i$, $j$) and the second electrode 122 ($i$, $j$) for each shift.

Finally, the processor 171 controls the measurement part 160 to measure the resistance of the portion of the measurement object 900 between the first electrode 112 ($i$, M) positioned at the ith row and the Nth column and the second electrode 122 ($i$, N) positioned at the ith row and the Nth column. Thus, the measurement part 160 acquires the X-direction resistance distribution in which the measured values of the resistances are associated with the positions in the X-direction of the ith row.

Then, the controller 170 displays the X-direction resistance distribution in the displayer 182. When a position exists in the X-direction at which the measured value of the resistance is greater than the measured values of the resistances of the other positions, the user can ascertain such an X-direction position from the displayed X-direction resistance distribution. Thus, the Y-direction resistance distribution may be acquired, and the X-direction resistance distribution may be subsequently acquired by narrowing down the Y-direction position and acquiring the X-direction resistance distribution at the Y-direction position at which the resistance is large. Thereby, the controller 170 can acquire data so that the position in the X-direction and the Y-direction at which the resistance is large can be efficiently ascertained.

Although the user extracts the row at which the resistance is large from the Y-direction resistance distribution displayed in the displayer 182 according to the embodiment, the processor 171 may automatically extract the row at which the resistance is large from the Y-direction resistance distribution and may automatically acquire the X-direction resistance distribution at the extracted row. Also, the processor 171 may acquire the X-direction resistance distribution, extract the column at which the resistance is large, and subsequently acquire the Y-direction resistance distribution at the extracted column.

The processor 171 may not extract the row or the column at which the resistance is large. For example, the processor 171 may control the measurement part 160 to measure the resistance between the first electrode 112 (1, 1) positioned at the first row and the first column and the second electrode 122 (M, N) positioned at the Mth row and the Nth column and the resistance between the first electrode 112 (1, N) positioned at the first row and the Nth column and the second electrode 122 (M, 1) positioned at the Mth row and the first column. Then, the processor 171 may measure the resistances of the portions between the first electrodes 112 and the second electrodes 122 that overlap each other when viewed in top-view for the positions between the first electrode 112 and the second electrode 122 that have the greater of the two measured resistance values. Thus, the processor 171 can control the measurement part 160 to somewhat narrow down the range in which the resistance is large by measuring the resistance between the first electrode 112 and the second electrode 122 that have multiple other first electrodes 112 and multiple other second electrodes 122 positioned therebetween and are at positions that do not overlap each other when viewed in top-view, and by sequentially shifting the measuring position in one direction.

In the resistance measurement method according to the embodiment as described above, the multiple first electrodes 112 are arranged in a lattice configuration in a first direction (the X-direction) and a second direction (the Y-direction) that is orthogonal to the first direction. Also, the multiple second electrodes 122 are arranged in a lattice configuration in the first and second directions. Then, in the step of measuring, the resistance of the portion of the measurement object 900 is measured between the first electrode 112 positioned furthest toward one side (the −X side) in the first direction among the multiple first electrodes 112 and the second electrode 122 positioned furthest toward the other side (the +X side) in the first direction among the multiple second electrodes 122. Therefore, the Y-direction resistance distribution can be efficiently acquired by shifting the position of the first and second electrodes 112 and 122 used to measure in the Y-direction.

Seventh Embodiment

A seventh embodiment will now be described.

Figure 14:
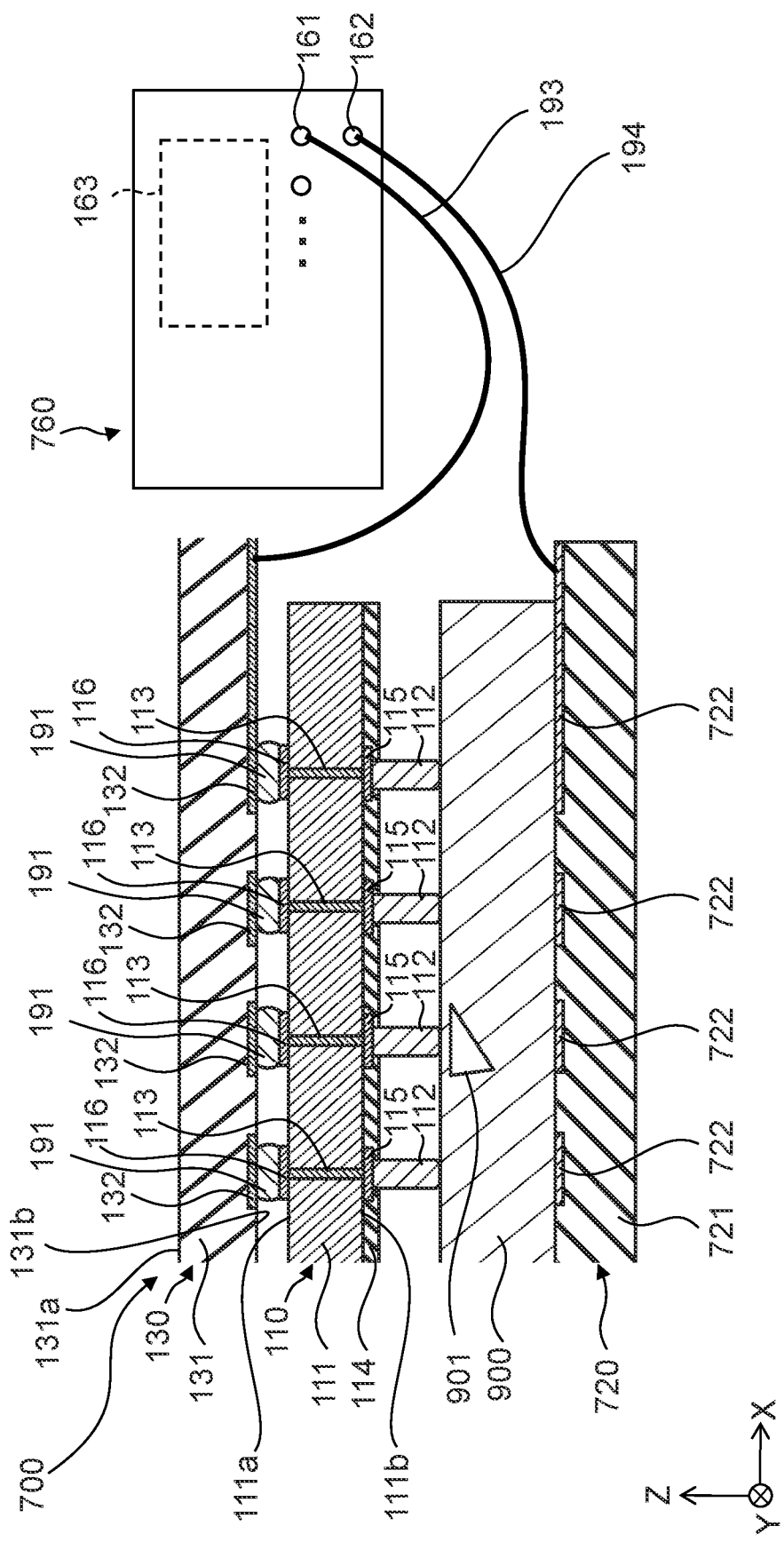
FIG. 14 is a partial end view showing a resistance measuring device according to a seventh embodiment.

FIG. 14 is a partial end view showing a resistance measuring device according to the embodiment.

The resistance measuring device 700 according to the embodiment differs from the resistance measuring device 100 according to the first embodiment in that a substrate 720 is provided instead of the second chip 120, the second wiring substrate 140, and the bonding member 192. Hereinbelow, the first chip 110 is called the chip 110.

The substrate 720 can be disposed to face the chip 110. The substrate 720 includes an insulating layer 721, and a conductive member 722 that is located on the insulating layer 721. The insulating layer 721 is made of an insulating material such as a resin material, etc. The conductive member 722 is made of a conductive material such as a metal material, etc. According to the embodiment, the conductive member 722 is a wiring layer that includes a pattern that faces all of the first electrodes 112.

Also, a measurement part 760 according to the embodiment differs from the measurement part 160 according to the first embodiment in that the number of the second terminals 162 is 1. The second terminal 162 is electrically connected to the conductive member 722 via the second lead wire 194.

As described above, the resistance measuring device 700 according to the embodiment includes the chip 110, the conductive member 722 that can be disposed to face the multiple first electrodes 112, and the measurement part 160 that is electrically connected to the multiple first electrodes 112 and the conductive member 722; and the resistance measuring device 700 is configured to measure the resistance of the portion of the measurement object 900 between the conductive member 722 and one of the multiple first electrodes 112 and the resistance of the portion of the measurement object 900 between the conductive member 722 and another one of the multiple first electrodes 112 in a state in which the measurement object 900 is disposed between the conductive member 722 and the multiple first electrodes 112. According to such a resistance measuring device 700 as well, the resistance distribution can be efficiently acquired.

The configuration of the conductive member is not limited to the configuration described above. For example, the conductive member may cover substantially the entire region of the upper surface of the insulating layer 721. Also, instead of the substrate 720, a plate-shaped conductive member that faces the multiple first electrodes 112 of the chip 110 may be provided in the resistance measuring device 700.

Embodiments may include the following configurations (e.g., technological proposals).

Configuration 1

A resistance mapping device, comprising:
a first chip including
a first surface,
a second surface positioned at a side opposite to the first surface, and
a plurality of first electrodes provided at the first surface;
a second chip including
a third surface facing the first surface,
a fourth surface positioned at a side opposite to the third surface, and
a plurality of second electrodes provided at the third surface, the plurality of second electrodes corresponding to the plurality of first electrodes; and
a measurement part electrically connected to the plurality of first electrodes and the plurality of second electrodes,
the measurement part being configured to
measure a resistance of a portion of a measurement object in a state in which the measurement object is disposed between the first chip and the second chip, the portion of the measurement object being between the first electrode and the second electrode that correspond to each other among the plurality of first electrodes and the plurality of second electrodes, and
acquire mapping data in which measured values of the resistances are associated with positions of the measurement object corresponding to the plurality of first electrodes.

Configuration 2

The device according to Configuration 1, further comprising:
a position adjustment mechanism adjusting relative positions of the plurality of first electrodes and the plurality of second electrodes.

Configuration 3

The device according to Configuration 1 or 2, wherein
the first chip further includes a third electrode next to one first electrode of the plurality of first electrodes at the first surface,
the second chip further includes a fourth electrode provided at the third surface, the fourth electrode corresponding to the third electrode,
the measurement part measures:
a current between the one first electrode and one second electrode of the plurality of second electrodes corresponding to the one first electrode; and
a voltage between the third electrode and the fourth electrode, and
based on a measured value of the current and a measured value of the voltage, the measurement part measures a resistance of a portion of the measurement object surrounded with the one first electrode, the one second electrode, the third electrode, and the fourth electrode.

Configuration 4

The device according to any one of Configurations 1 to 3, wherein
the first chip further includes a plurality of first through-electrodes electrically connected to the plurality of first electrodes, and
the plurality of first through-electrodes extends in a direction from the first surface toward the second surface.

Configuration 5

The device according to Configuration 4, further comprising:
a first wiring substrate mounted to the second surface,
the first wiring substrate including a plurality of first interconnects configured to connect the measurement part and the plurality of first through-electrodes,
a surface area of the first wiring substrate when viewed in plan being greater than a surface area of the first chip when viewed in plan.

Configuration 6

The device according to any one of Configurations 1 to 5, wherein
the second chip further includes a plurality of second through-electrodes electrically connected to the plurality of second electrodes, and
the plurality of second through-electrodes extends in a direction from the third surface toward the fourth surface.

Configuration 7

The device according to Configuration 6, further comprising:

a second wiring substrate mounted to the fourth surface, the second wiring substrate including a plurality of second interconnects configured to connect the measurement part and the plurality of second through-electrodes, a surface area of the second wiring substrate when viewed in plan being greater than a surface area of the second chip when viewed in plan.

Configuration 8

The device according to any one of Configurations 1 to 7, wherein the plurality of first electrodes and the plurality of second electrodes each are bumps.

Configuration 9

The device according to any one of Configurations 1 to 7, wherein the plurality of first electrodes and the plurality of second electrodes each are wires.

Configuration 10

The device according to any one of Configurations 1 to 7, wherein the plurality of first electrodes and the plurality of second electrodes each are plate springs or MEMS.

Configuration 11

A resistance measuring device, comprising:

a first chip including
a first surface,
a second surface positioned at a side opposite to the first surface, and
a plurality of first electrodes provided at the first surface;

a second chip including
a third surface facing the first surface,
a fourth surface positioned at a side opposite to the third surface, and
a plurality of second electrodes provided at the third surface, the plurality of second electrodes corresponding to the plurality of first electrodes; and a measurement part electrically connected to the plurality of first electrodes and the plurality of second electrodes,
the measurement part being configured to measure:
a resistance of a portion of a measurement object between one of the plurality of first electrodes and one of the plurality of second electrodes in a state in which the measurement object is disposed between the first chip and the second chip; and
a resistance of a portion of the measurement object between an other one of the plurality of first electrodes and an other one of the plurality of second electrodes in the state in which the measurement object is disposed between the first chip and the second chip.

Configuration 12

A resistance measuring device, comprising:

a chip including
a first surface,
a second surface positioned at a side opposite to the first surface, and
a plurality of first electrodes provided at the first surface;

a conductive member that can be disposed to face the plurality of first electrodes; and a measurement part electrically connected to the conductive member and the plurality of first electrodes,
the measurement part being configured to measure:
a resistance of a portion of a measurement object between the conductive member and one of the plurality of first electrodes in a state in which the measurement object is disposed between the conductive member and the plurality of first electrodes; and
a resistance of a portion of the measurement object between the conductive member and an other one of the plurality of first electrodes in the state in which the measurement object is disposed between the conductive member and the plurality of first electrodes.

Configuration 13

A resistance measurement method, the method comprising:

disposing a measurement object between a first chip and a second chip, the first chip including
a first surface,
a second surface positioned at a side opposite to the first surface, and
a plurality of first electrodes provided at the first surface, the second chip including
a third surface facing the first surface,
a fourth surface positioned at a side opposite to the third surface, and
a plurality of second electrodes provided at the third surface, the plurality of second electrodes corresponding to the plurality of first electrodes; and measuring
a resistance of a portion of the measurement object between one of the plurality of first electrodes and one of the plurality of second electrodes, and
a resistance of a portion of the measurement object between an other one of the plurality of first electrodes and an other one of the plurality of second electrodes.

Configuration 14

The method according to Configuration 13, wherein the measuring includes measuring the resistance of the portion of the measurement object between the first electrode and the second electrode that are disposed at positions overlapping each other when viewed from above among the plurality of first electrodes and the plurality of second electrodes.

Configuration 15

The method according to Configuration 13, wherein the measuring includes measuring the resistance of the portion of the measurement object between the first electrode and the second electrode that are disposed at positions not overlapping each other when viewed from above among the plurality of first electrodes and the plurality of second electrodes.

Configuration 16

The method according to Configuration 15, wherein the plurality of first electrodes is arranged in a lattice configuration in a first direction and in a second direction orthogonal to the first direction, the plurality of second electrodes is arranged in a lattice configuration in the first and second directions, and the measuring includes measuring the resistance of the portion of the measurement object between the first electrode positioned furthest toward one side in the first direction among the plurality of first electrodes and the second electrode positioned furthest toward an other side in the first direction among the plurality of second electrodes.

Configuration 17

A resistance measurement method, the method comprising:
disposing a measurement object between a chip and a conductive member,
the chip including
a first surface,
a second surface positioned at a side opposite to the first surface, and
a plurality of first electrodes provided at the first surface,
the conductive member facing the plurality of first electrodes; and
measuring
a resistance of a portion of the measurement object between the conductive member and one of the plurality of first electrodes, and
a resistance of a portion of the measurement object between the conductive member and an other one of the plurality of first electrodes.

Configuration 18

A program configured to cause a processor to perform at least:
measuring
a resistance of a portion of a measurement object between one of a plurality of first electrodes and one of a plurality of second electrodes in a state in which the measurement object is disposed between a first chip and a second chip, and
a resistance of a portion of the measurement object between an other one of the plurality of first electrodes and an other one of the plurality of second electrodes in the state in which the measurement object is disposed between the first chip and the second chip,
the first chip including
a first surface,
a second surface positioned at a side opposite to the first surface, and
the plurality of first electrodes provided at the first surface,
the second chip including
a third surface facing the first surface,
a fourth surface positioned at a side opposite to the third surface, and
the plurality of second electrodes provided at the third surface,
the plurality of second electrodes corresponding to the plurality of first electrodes.

Configuration 19

A program configured to cause a processor to perform at least:
measuring
a resistance of a portion of a measurement object between a conductive member and one of a plurality of first electrodes in a state in which the measurement object is disposed between the conductive member and a chip, and
a resistance of a portion of the measurement object between the conductive member and an other one of the plurality of first electrodes in the state in which the measurement object is disposed between the conductive member and the chip,
the chip including
a first surface,
a second surface positioned at a side opposite to the first surface, and
the plurality of first electrodes provided at the first surface,
the conductive member facing the plurality of first electrodes.

Configuration 20

A recording medium storing the program according to Configuration 18 or 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A resistance mapping device, comprising:
a first chip including
a first surface,
a second surface positioned at a side opposite to the first surface, and
a plurality of first electrodes provided at the first surface;
a second chip including
a third surface facing the first surface,
a fourth surface positioned at a side opposite to the third surface, and
a plurality of second electrodes provided at the third surface, the plurality of second electrodes corresponding to the plurality of first electrodes; and
a measurement part electrically connected to the plurality of first electrodes and the plurality of second electrodes,
the measurement part being configured to
measure a resistance of a portion of a measurement object in a state in which the measurement object is disposed between the first chip and the second chip, the portion of the measurement object being between the first electrode and the second electrode that correspond to each other among the plurality of first electrodes and the plurality of second electrodes, and
acquire mapping data in which measured values of the resistances are associated with positions of the measurement object corresponding to the plurality of first electrodes.

2. The device according to claim 1, further comprising:
a position adjustment mechanism adjusting relative positions of the plurality of first electrodes and the plurality of second electrodes.

3. The device according to claim 1, wherein
the first chip further includes a third electrode next to one first electrode of the plurality of first electrodes at the first surface,
the second chip further includes a fourth electrode provided at the third surface, the fourth electrode corresponding to the third electrode,
the measurement part measures:
a current between the one first electrode and one second electrode of the plurality of second electrodes corresponding to the one first electrode; and
a voltage between the third electrode and the fourth electrode, and based on a measured value of the current and a measured value of the voltage, the measurement part measures a resistance of a portion of the measurement object surrounded with the one first electrode, the one second electrode, the third electrode, and the fourth electrode.

4. The device according to claim 1, wherein
the first chip further includes a plurality of first through-electrodes electrically connected to the plurality of first electrodes, and
the plurality of first through-electrodes extends in a direction from the first surface toward the second surface.

5. The device according to claim 4, further comprising:
a first wiring substrate mounted to the second surface,
the first wiring substrate including a plurality of first interconnects configured to connect the measurement part and the plurality of first through-electrodes,
a surface area of the first wiring substrate when viewed in plan being greater than a surface area of the first chip when viewed in plan.

6. The device according to claim 1, wherein
the second chip further includes a plurality of second through-electrodes electrically connected to the plurality of second electrodes, and
the plurality of second through-electrodes extends in a direction from the third surface toward the fourth surface.

7. The device according to claim 6, further comprising:
a second wiring substrate mounted to the fourth surface,
the second wiring substrate including a plurality of second interconnects configured to connect the measurement part and the plurality of second through-electrodes,
a surface area of the second wiring substrate when viewed in plan being greater than a surface area of the second chip when viewed in plan.

8. The device according to claim 1, wherein
the plurality of first electrodes and the plurality of second electrodes each are bumps.

9. The device according to claim 1, wherein
the plurality of first electrodes and the plurality of second electrodes each are wires.

10. The device according to claim 1, wherein the plurality of first electrodes and the plurality of second electrodes each are plate springs or MEMS.

11. A resistance measurement method, the method comprising:
disposing a measurement object between a first chip and a second chip,
the first chip including
a first surface,
a second surface positioned at a side opposite to the first surface, and
a plurality of first electrodes provided at the first surface,
the second chip including
a third surface facing the first surface,
a fourth surface positioned at a side opposite to the third surface, and
a plurality of second electrodes provided at the third surface, the plurality of second electrodes corresponding to the plurality of first electrodes; and
measuring
a resistance of a portion of the measurement object between one of the plurality of first electrodes and one of the plurality of second electrodes, and
a resistance of a portion of the measurement object between an other one of the plurality of first electrodes and an other one of the plurality of second electrodes.

12. The method according to claim 11, wherein
the measuring includes measuring the resistance of the portion of the measurement object between the first electrode and the second electrode that are disposed at positions overlapping each other when viewed from above among the plurality of first electrodes and the plurality of second electrodes.

13. The method according to claim 11, wherein
the measuring includes measuring the resistance of the portion of the measurement object between the first electrode and the second electrode that are disposed at positions not overlapping each other when viewed from above among the plurality of first electrodes and the plurality of second electrodes.

14. The method according to claim 13, wherein
the plurality of first electrodes is arranged in a lattice configuration in a first direction and in a second direction orthogonal to the first direction,
the plurality of second electrodes is arranged in a lattice configuration in the first and second directions, and
the measuring includes measuring the resistance of the portion of the measurement object between the first electrode positioned furthest toward one side in the first direction among the plurality of first electrodes and the second electrode positioned furthest toward an other side in the first direction among the plurality of second electrodes.

15. A non-transitory computer program product comprising a computer readable storage medium storing a program,
the program configured to cause a processor to perform at least:
measuring
a resistance of a portion of a measurement object between one of a plurality of first electrodes and one of a plurality of second electrodes in a state in which the measurement object is disposed between a first chip and a second chip, and
a resistance of a portion of the measurement object between an other one of the plurality of first electrodes and an other one of the plurality of second electrodes in the state in which the measurement object is disposed between the first chip and the second chip,
the first chip including
a first surface,
a second surface positioned at a side opposite to the first surface, and
the plurality of first electrodes provided at the first surface,
the second chip including
a third surface facing the first surface,
a fourth surface positioned at a side opposite to the third surface, and
the plurality of second electrodes provided at the third surface,
the plurality of second electrodes corresponding to the plurality of first electrodes.

* * * * *